United States Patent
Jung et al.

(10) Patent No.: US 9,979,220 B2
(45) Date of Patent: May 22, 2018

(54) ELECTRONIC DEVICE AND METHOD FOR CONTROLLING CHARGING OF THE SAME

(71) Applicant: Samsung Electronics Co., Ltd., Suwon-si (KR)

(72) Inventors: Kuchul Jung, Seoul (KR); Sanghyun Ryu, Suwon-si (KR); Chulwoo Park, Suwon-si (KR); Sunggeun Yoon, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 142 days.

(21) Appl. No.: 15/053,880

(22) Filed: Feb. 25, 2016

(65) Prior Publication Data
US 2016/0254688 A1    Sep. 1, 2016

(30) Foreign Application Priority Data
Feb. 27, 2015  (KR) .......................... 10-2015-0028493

(51) Int. Cl.
*H02J 7/00* (2006.01)
*G01R 31/36* (2006.01)
*G01R 19/00* (2006.01)

(52) U.S. Cl.
CPC .......... *H02J 7/007* (2013.01); *G01R 19/0084* (2013.01); *G01R 31/362* (2013.01)

(58) Field of Classification Search
CPC ... H02J 2007/0039; H02J 7/0031; H02J 7/007
USPC ........................................................ 320/164
See application file for complete search history.

(56) References Cited

U.S. PATENT DOCUMENTS

| | | | | |
|---|---|---|---|---|
| 5,729,061 A | * | 3/1998 | Narita ..................... | H02H 7/18 307/116 |
| 7,215,096 B2 | * | 5/2007 | Miura et al. .......... | H02J 7/0031 320/134 |
| 7,553,583 B2 | * | 6/2009 | Eaves ................. | H01M 10/425 320/122 |

(Continued)

FOREIGN PATENT DOCUMENTS

| JP | 2013-153614 | 8/2013 |
|---|---|---|
| KR | 2007-0070735 | 7/2007 |

(Continued)

*Primary Examiner* — Sun Lin
(74) *Attorney, Agent, or Firm* — McAndrews, Held & Malloy, Ltd.

(57) ABSTRACT

An electronic device of the present disclosure includes a battery cell configured to be electrically connected between a first node and a second node; an over current protection circuit configured to include a first terminal, a second terminal, and a switching element responsive to an occurrence of over current, and the first terminal is electrically connected to the first node; a power management integrated circuit configured to be electrically connected to the second terminal of the over current protection circuit; and a first protection circuit configured to be electrically connected between the first node and the power management integrated circuit, and to include at least one first passive element, wherein the power management integrated circuit monitors a voltage of the battery cell, based on at least a portion of a voltage or a current which is transmitted through the first protection circuit.

19 Claims, 14 Drawing Sheets

(56) References Cited

U.S. PATENT DOCUMENTS

| | | | |
|---|---|---|---|
| 8,258,749 B2* | 9/2012 | Sinreich ............. | G05B 19/0423 |
| | | | 320/128 |
| 8,994,331 B2* | 3/2015 | Kerfoot, Jr. et al. . | H02J 7/0024 |
| | | | 320/107 |
| 9,219,368 B2* | 12/2015 | Kurokawa et al. ... | H02J 7/0029 |
| 9,735,570 B2* | 8/2017 | Sinreich ................... | H02J 1/00 |
| 2009/0001935 A1 | 1/2009 | Odaohhara | |
| 2013/0193924 A1 | 8/2013 | Kurokawa et al. | |

FOREIGN PATENT DOCUMENTS

| KR | 2008-0062384 | 7/2008 |
|---|---|---|
| KR | 2010-0079598 | 7/2010 |

* cited by examiner

ELECTRONIC DEVICE AND METHOD FOR CONTROLLING CHARGING OF THE SAME

RELATED APPLICATION(S)

This application claims the benefit under 35 U.S.C. § 119(a) of Korean patent application filed on Feb. 27, 2015 in the Korean Intellectual Property Office and assigned Serial number 10-2015-0028493, the entire disclosure of which is hereby incorporated by reference.

BACKGROUND

The present disclosure relates to an electronic device which can shorten a charging time through a precise battery voltage measurement, and a method for controlling a charging of the same.

In general, an electronic device, such as a smart phone, a tablet Personal Computer (PC), a portable multimedia player (PMP), a personal digital assistant (PDA), a laptop Personal Computer (PC) and a wearable device such as a wrist watch, and a Head-Mounted Display (HMD), may include various functions (e.g., social network service (SNS), Internet, multimedia, photographing and executing picture and video) as well as a call function. Thus, as a portable electronic device includes various functions, a current consumed by a processor is increased. Therefore, an interest in various high-performance batteries and a charging technology is increased. In particular, when charging a battery, a need for a technology for shortening a charge time is increased.

SUMMARY

The present disclosure may provide an electronic device which can precisely measure a battery voltage, and shorten a charging time by controlling a charging operation based on the measured voltage, and a method for controlling a charging of the same.

In accordance with an aspect of the present disclosure, an electronic device includes: a battery cell configured to be electrically connected between a first node and a second node; an over current protection circuit configured to include a first terminal, a second terminal, and a switching element responsive to an occurrence of over current, and the first terminal is electrically connected to the first node; a power management integrated circuit configured to be electrically connected to the second terminal of the over current protection circuit; and a first protection circuit configured to be electrically connected between the first node and the power management integrated circuit, and to include at least one first passive element, wherein the power management integrated circuit monitors a voltage of the battery cell, based on at least a portion of a voltage or a current which is transmitted through the first protection circuit.

In accordance with another aspect of the present disclosure, a method for controlling a charging of an electronic device comprising a battery cell, a power management integrated circuit, an over current protection circuit connected between the battery cell and the power management integrated circuit, and a first protection circuit including at least one first passive element between the power management integrated circuit and the battery cell includes: monitoring a voltage of the battery cell, based on at least a portion of a voltage or a current which is transmitted through the first protection circuit.

BRIEF DESCRIPTION OF THE DRAWINGS

The objects, features and advantages of the present disclosure will be more apparent from the following detailed description in conjunction with the accompanying drawings, in which.

DETAILED DESCRIPTION

Figure 1:
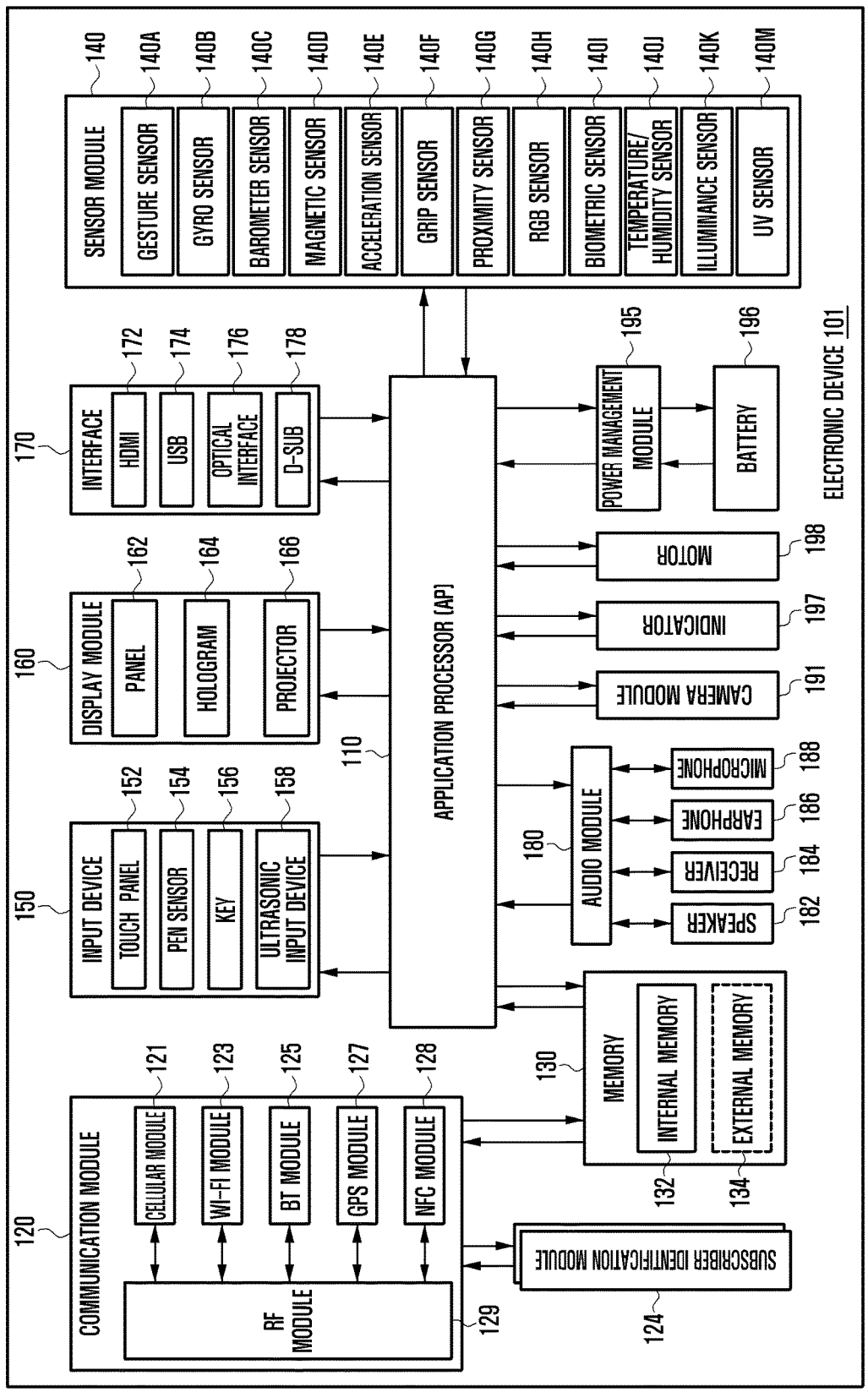
FIG. 1 is a block diagram illustrating a configuration of an electronic device according to an embodiment of the present disclosure.

Embodiments of the present disclosure are described with reference to the accompanying drawings in detail. The same reference numbers are used throughout the drawings to refer to the same or like parts. Detailed descriptions of well-known functions and structures incorporated herein may be omitted to avoid obscuring the subject matter of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The expressions such as "include" and "may include" which may be used in the present disclosure denote the presence of the disclosed functions, operations, and constituent elements and do not limit one or more additional functions, operations, and constituent elements. In the present disclosure, the terms such as "include" and/or "have" may be construed to denote a certain characteristic, number, operation, constituent element, component or a combination thereof, but may not be construed to exclude the existence of or a possibility of addition of one or more other characteristics, numbers, operations, constituent elements, components or combinations thereof.

Furthermore, in the present disclosure, the expression "and/or" includes any and all combinations of the associated listed words. For example, the expression "A and/or B" may include A, may include B, or may include both A and B.

In the present disclosure, expressions including ordinal numbers, such as "first" and "second," and/or the like, may modify various elements. However, such elements are not limited by the above expressions. For example, the above expressions do not limit the sequence and/or importance of the elements. The above expressions are used merely for the purpose to distinguish an element from the other elements. For example, a first user device and a second user device indicate different user devices although both of the first user device and the second user device are user devices. For example, a first element could be termed a second element, and similarly, a second element could be also termed a first element without departing from the scope of the present disclosure.

In the case according to which a component is referred to as being "connected" or "accessed" to other component, it should be understood that not only the component is directly connected or accessed to the other component, but also there may exist another component between the component and the other component. Meanwhile, in the case according to which a component is referred to as being "directly connected" or "directly accessed" to other component, it should be understood that there is no component therebetween. The terms used in the present disclosure are only used to describe specific various embodiments, and are not intended to limit the present disclosure. As used herein, the singular forms are intended to include the plural forms as well, unless the context clearly indicates otherwise. Singular forms are intended to include plural forms unless the context clearly indicates otherwise.

An electronic device according to the present disclosure may be a device including a communication function. For example, the device corresponds to a combination of at least one of a smartphone, a tablet Personal Computer (PC), a mobile phone, a video phone, an e-book reader, a desktop PC, a laptop PC, a netbook computer, a Personal Digital Assistant (PDA), a Portable Multimedia Player (PMP), a digital audio player, a mobile medical device, an electronic bracelet, an electronic necklace, an electronic accessory, a camera, a wearable device, an electronic clock, a wrist watch, home appliances (e.g., an air-conditioner, vacuum, an oven, a microwave, a washing machine, an air cleaner, and/or the like), an artificial intelligence robot, a Television (TV), a Digital Video Disk (DVD) player, an audio device, various medical devices (e.g., Magnetic Resonance Angiography (MRA), Magnetic Resonance Imaging (MRI), Computed Tomography (CT), a scanning machine, an ultrasonic wave device, and/or the like), a navigation device, a Global Positioning System (GPS) receiver, an Event Data Recorder (EDR), a Flight Data Recorder (FDR), a set-top box, a TV box (e.g., Samsung HomeSync™, Apple TV™, or Google TV™), an electronic dictionary, vehicle infotainment device, an electronic equipment for a ship (e.g., navigation equipment for a ship, gyrocompass, and/or the like), avionics, a security device, electronic clothes, an electronic key, a camcorder, game consoles, a Head-Mounted Display (HMD), a flat panel display device, an electronic frame, an electronic album, furniture or a portion of a building/structure that includes a communication function, an electronic board, an electronic signature receiving device, a projector, and/or the like. It is obvious to those skilled in the art that the electronic device according to the present disclosure is not limited to the aforementioned devices.

According to various embodiments of the present disclosure, an electronic device supporting short-range communication may support a master-single slave connection, a master-multi slave connection, and a scatternet connection. The electronic device may be a device restrictively operated by the master-single slave connection, for example, a wearable device or an accessory electronic device, but the electronic device of the present disclosure is not limited thereto.

FIG. 1 is a block diagram illustrating a configuration of electronic device according to an embodiment of the present disclosure.

As illustrated in FIG. 1, the electronic device 100 may include an application processor (AP) 110, a Subscriber Identification Module (SIM) card 124, a communication module 120, a memory 130, a sensor module 140, an input module 150, a display module 160, an interface module 170, an audio module 180 (e.g., audio coder/decoder (codec)), a camera module 191, a power management module 195, a battery pack 196, an indicator 197, a motor 198 and any other similar and/or suitable components.

The AP 110 (e.g., the processor) may include one or more Application Processors (APs), or one or more Communication Processors (CPs).

The AP 110 may execute an Operating System (OS) or an application program, and thereby may control multiple hardware or software elements connected to the AP 110 and may perform processing and arithmetic operations on various data including multimedia data. The AP 110 may be implemented by, for example, a System on Chip (SoC). According to various embodiments of the present disclosure, the AP 110 may further include a Graphical Processing Unit (GPU) (not illustrated).

The SIM card 124 may be a card implementing a subscriber identification module, and may be inserted into a slot formed in a particular portion of the electronic device 100. The SIM card 124 may include unique identification information (e.g., Integrated Circuit Card IDentifier (ICCID)) or subscriber information (e.g., International Mobile Subscriber Identity (IMSI)).

The communication module 120 may include a Radio Frequency (RF) module 129. The communication module 120 may further include, for example, a cellular module 121, a Wi-Fi module 123, a Bluetooth (BT) module 125, a GPS module 127, and a Near Field Communications (NFC) module 128. For example, the communication module 120 may provide a wireless communication function by using a radio frequency. Additionally or alternatively, the communication module 120 may include a network interface (e.g., a Local Area Network (LAN) card), a modulator/demodulator (modem), and/or the like for connecting the electronic device 100 to a network (e.g., the Internet, a LAN, a Wide Area Network (WAN), a telecommunication network, a cellular network, a satellite network, a Plain Old Telephone Service (POTS), and/or the like).

The cellular module 121 may further include a Communication Processor (CP). The CP may control transmission and reception of data by the communication module 120. As illustrated in FIG. 1, elements such as the CP, the power management module 195, the memory 130, and the like are illustrated as elements separate from the AP 110. However, according to various embodiments of the present disclosure, the AP 110 may include one or more of the above-described elements (e.g., the CP). The CP may manage a data line and may convert a communication protocol in the case of communication between the electronic device (e.g., the electronic device 100) and different electronic devices connected to the electronic device 100 through the network.

The RF module 129 may be used for transmission and reception of data, for example, transmission and reception of RF signals or called electronic signals. Although not illustrated, the RF module 129 may include, for example, a transceiver, a Power Amplifier Module (PAM), a frequency filter, a Low Noise Amplifier (LNA), and/or the like.

In addition, the RF module 129 may further include a component for transmitting and receiving electromagnetic waves in a free space in a wireless communication, for example, a conductor, a conductive wire, or the like.

The memory 130 may include an internal memory 132 and an external memory 134. According to various embodiments of the present disclosure, internal memory 132 may include, for example, at least one of a volatile memory (e.g., a Dynamic Random Access Memory (DRAM), a Static Random Access Memory (SRAM), a Synchronous Dynamic Random Access Memory (SDRAM), and/or the like), and a non-volatile memory (e.g., a One Time Programmable Read-Only Memory (OTPROM), a Programmable Read-Only Memory (PROM), an Erasable and Programmable Read-Only Memory (EPROM), an Electrically Erasable and Programmable Read-Only Memory (EEPROM), a mask Read-Only Memory, a flash Read-Only Memory, a Not AND (NAND) flash memory, a Not OR (NOR) flash memory, and/or the like). According to various embodiments of the present disclosure, the internal memory 132 may be in the form of a Solid State Drive (SSD). The external memory 134 may further include a flash drive, for example, a Compact Flash (CF), a Secure Digital (SD), a Micro-Secure Digital (Micro-SD), a Mini-Secure Digital (Mini-SD), an extreme Digital (xD), a memory stick, and/or the like.

The sensor module 140 may include, for example, at least one of a gesture sensor 140A, a gyro sensor 140B, an atmospheric pressure sensor 140C, a magnetic sensor 140D, an acceleration sensor 140E, a grip sensor 140F, a proximity sensor 140G, a Red, Green and Blue (RGB) sensor 140H, a biometric sensor 140I, a temperature/humidity sensor 140J, an illuminance sensor 140K, and a Ultra Violet (UV) sensor 140M. The sensor module 140 may measure a physical quantity and/or may detect an operating state of the electronic device 100, and may convert the measured or detected information to an electrical signal.

Additionally/alternatively, the sensor module 140 may include, for example, an E-nose sensor (not illustrated), an electromyography (EMG) sensor (not illustrated), an electroencephalogram (EEG) sensor (not illustrated), an electrocardiogram (ECG) sensor (not illustrated), a fingerprint sensor (not illustrated), and/or the like. Additionally or alternatively, the sensor module 140 may include, for example, an E-nose sensor (not illustrated), an EMG sensor (not illustrated), an EEG sensor (not illustrated), an ECG sensor (not illustrated), a fingerprint sensor, and/or the like. The sensor module 140 may further include a control circuit (not illustrated) for controlling one or more sensors included therein.

The input module 150 may include a touch panel 152, a pen sensor 154 (e.g., a digital pen sensor), keys 156, and an ultrasonic input unit 158. The touch panel 152 may recognize a touch input in at least one of, for example, a capacitive scheme, a resistive scheme, an infrared scheme, an acoustic wave scheme, and the like. In addition, the touch panel 152 may further include a controller (not illustrated). In the capacitive type, the touch panel 152 is capable of recognizing proximity as well as a direct touch. The touch panel 152 may further include a tactile layer (not illustrated). In this event, the touch panel 152 may provide a tactile response to the user.

The pen sensor 154 (e.g., a digital pen sensor), for example, may be implemented by using a method identical or similar to a method of receiving a touch input from the user, or by using a separate sheet for recognition. For example, a key pad or a touch key may be used as the keys 156.

The ultrasonic input unit 158 enables the terminal to detect a sound wave by using a microphone (e.g., a microphone 188) of the terminal through a pen generating an ultrasonic signal, and to identify data. The ultrasonic input unit 158 is capable of wireless recognition. According to various embodiments of the present disclosure, the electronic device 100 may receive a user input from an external device (e.g., a network, a computer, a server, and/or the like), which is connected to the communication module 120, through the communication module 120.

The display module 160 may include a panel 162, a hologram 164, a projector 166, and/or the like. The panel 162 may be, for example, a Liquid Crystal Display (LCD) and an Active Matrix Organic Light Emitting Diode (AMOLED) display, and/or the like. The panel 162 may be implemented so as to be, for example, flexible, transparent, or wearable. The panel 162 may include the touch panel 152 and one module. The hologram 164 may display a three-dimensional image in the air by using interference of light. According to various embodiments of the present disclosure, the display module 160 may further include a control circuit for controlling the panel 162 or the hologram 164.

The interface module 170 may include an High-Definition Multimedia Interface (HDMI) module 172, a Universal Serial Bus (USB) module 174, an optical interface module 176, a D-subminiature (D-SUB) module 178, and/or the like. Additionally or alternatively, the interface module 170 may include, for example, one or more interfaces for Secure Digital (SD)/MultiMedia Card (MMC) (not shown) or Infrared Data Association (IrDA) (not shown). The interface module 170 or any of its sub-modules may be configured to interface with another electronic device (e.g., an external electronic device), an input device, an external storage device, and/or the like.

The audio module 180 may encode/decode voice into electrical signal, and vice versa. The audio module 180 may, for example, encode/decode voice information that are input into, or output from, a speaker 182, a receiver 184, an earphone 186, and/or a microphone 188.

The camera module 191 may capture still images or video. According to various embodiments of the present disclosure, the camera module 191 may include one or more image sensors (e.g., front sensor module or rear sensor module; not shown), an Image Signal Processor (ISP, not shown), or a flash Light-Emitting Diode (flash LED, not shown).

A power management module 195 may manage, for example, a power of the electronic device 100. According to an embodiment, the power management module 195 may include a power management integrated circuit (PMIC), a charger integrated circuit (IC), or a battery or fuel gauge. The PMIC may have a wired and/or wireless charging type. The wireless charging type may include, for example, a magnetic resonance type, a magnetic induction type, or an electromagnetic wave type, and may further include an additional circuit for wireless charging, for example, a coil loop, a resonant circuit, or a rectifier. The battery gauge may measure, for example, a remaining amount of a battery pack 196, a charging voltage, current, or temperature. The battery pack 196 may include, for example, a rechargeable battery and/or a solar battery. According to an embodiment, the power management module 195 may include a sensing pin for measuring the voltage of a battery cell 196B (as shown in FIG. 2).

The power management module 195 may be electrically connected to an interface module 170. According to an embodiment, the power management module 195 may detect whether an external power supply unit (e.g., Travel Adapter (TA), etc.) is connected to the interface module 170. For example, the power management module 195 may detect a connection of the external power supply unit according to whether power is supplied through the interface module 170 or whether a certain signal is received through the interface module 170. For example, the battery pack 196 may detect that an external power supply unit is connected, when being supplied with power through a USB type connector which may be received at the interface module 170, or when receiving a specific signal from the external power supply unit connected with a connector.

Figure 2:
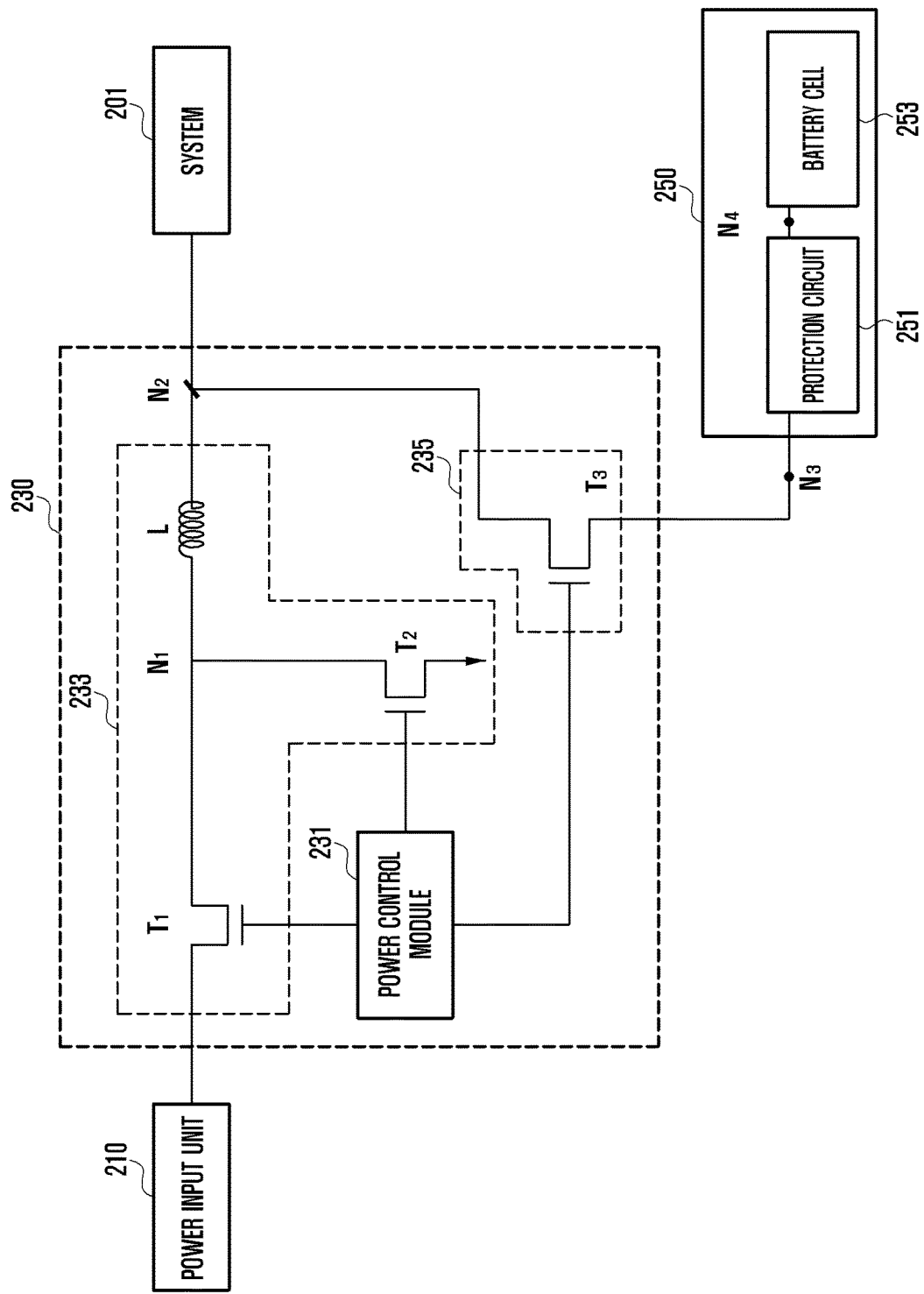
FIG. 2 is a block diagram illustrating an electronic device according to an embodiment of the present disclosure.

The power management module 195 may detect the voltage of the battery cell 196B (as shown in FIG. 2) through a sensing line. The sensing line may be a line connecting the battery cell 196B with the power management module 195 to measure the voltage of the battery cell 196B. According to an embodiment, the sensing line may be formed of a line having high impedance in order to detect the correct voltage of the battery cell 196B. According to an embodiment, the sensing line may include a terminal for detecting the voltage of the battery cell 196B. According to an embodiment, the sensing line may include a manual device (e.g., resistance, etc.) for preventing the battery cell 196B from being damaged due to electrical surges.

According to an embodiment, the power management module 195 may detect the voltage of the battery cell 196B in a differential sensing method. For example, the power management module 195 may measure the voltage of the battery cell 196B by comparing a difference between signals detected at each terminal through the sensing line connected to both terminals (a positive terminal and a negative terminal) of the battery cell 196B.

The power management module 195 may detect the voltage of the battery cell 196B via a remote sensing method. For example, the power management module 195 may measure the voltage of the battery cell 196B remotely without a direct contact with the battery cell 196B through the sensing line having high impedance.

The power management module 195 may control an operation of charging supplied to the battery pack 196 based on the voltage of the detected battery cell 196B.

According to an embodiment, the power management module 195 may charge the battery cell 196B via a constant current (CC)-constant voltage (CV) (CC-CV) method. The power management module 195 may initially charge the battery cell 196B (as shown in FIG. 2) in a CC method. A high charging current may be transferred to the battery cell 196B to accomplish a high speed charging by using the CC method. Then, in the later procedure after the charging of the battery cell 196B is progressed to some extent, the charging current supplied to the battery cell 196B may be gradually reduced while maintaining the voltage of the battery cell 196B by using a CV method. For example, when the external power supply unit is connected to the interface module 170, the power management module 195 may charge the battery pack 196 in the CC method. When detecting that the voltage of the battery cell 196B is at a reference voltage or higher during charging, the power management module 195 may charge the battery pack 196 in the CV method. When the voltage of the battery cell 196B reaches a preset reference voltage, the power management module 195 may switch the charging method from the CV method to the CC method.

For example, when measuring the voltage of an external terminal of the battery pack 196 or a point including other internal resistance components, a voltage value higher than the actual voltage of the battery cell 196B may be measured due to the current flowing internally (e.g., through a thermistor, a protection circuit module (PCM) 196A as shown in FIG. 2, etc.) of the battery pack 196. Therefore, when the electronic device 100 switches the charging method from the CC method to the CV method based on the voltage measured in the battery pack 196, etc., the charging may be considered to be almost completed even though the charging voltage does not reach the reference value, and, accordingly, the battery may be charged via the CV method. That is, since the charge current may be reduced at the point of time earlier than an intended point of time after starting the charging, the charging time of the battery may be prolonged. According to various embodiments, the electronic device 100 (e.g., the power management module 195) may sense the voltage of the battery cell 196B and change the charging method according to the voltage sensed at the battery cell 196B to increase the charging time of the CC method and decrease the charging time of the CV method, thereby reducing the battery charging time.

According to an embodiment, the electronic device 100 may include a switch (not shown) for blocking a power leakage path including the sensing line. According to an embodiment, the power management module 195 may control the switch for blocking the leakage path according to an operation state of the PCM 196A. For example, when the PCM 196A of FIG. 2 is open, the power management module 195 may control the switch to open a circuit connected to the switch. For example, in the electronic device 100 (e.g., the battery pack 196), due to the sensing line which is added to measure the voltage of the battery cell 196B, other power leakage path may exist even if the PCM 196A is off, that is, open. That is, unnecessary power leakage may result.

According to various embodiments of the disclosure, the electronic device 100 may include a switch for blocking the leakage path, and control the switch to open the circuit when the PCM 196A is open, thereby blocking the leakage path and keeping the power.

According to an embodiment, the power management module 195 may control the switch for blocking the leakage path according to the voltage value of the battery cell 196B. For example, when the voltage of the battery cell 196B is at or above a preset threshold value, the power management module 195 may control the switch to open the circuit connected to the switch.

According to an embodiment, when a temperature of the battery pack 196 is at a preset value or higher while charging the battery pack 196, the power management module 195 may stop the charging. For example, the power management module 195 may detect the temperature of the battery pack 196 through a thermistor (not shown) of the battery pack 196. For example, the power management module 195 may detect the temperature of the battery pack 196 via a positive temperature coefficient (PTC). When the temperature of the battery pack 196 (or the battery cell 196B) is higher than a certain value, the power management module 195 may stop the charging to avoid damaging the battery pack 196.

According to an embodiment, the AP 110 and the power management module 195 may be implemented in a single integrated module. For example, the electronic device 100 may include a module that performs all of the functions of the AP 110 and the power management module 195. According to an embodiment, the battery pack 196 may include the PCM 196A and the battery cell 196B.

The PCM 196A may avoid the over-charging, the over-discharging or the over-current of the battery pack 196. For example, when the voltage of the battery cell 196B is at or above an over-charging reference voltage, the PCM 196A may be opened to preserve the life span of the battery cell 196B. When the voltage of the battery cell 196B drops below the over-discharge reference voltage, the PCM 196A may be opened to avoid damages to the battery cell 196B. In addition, when the over-current of the battery cell 196B is detected, the PCM 196A may be opened to avoid damages to the battery cell 196B. According to various embodiments of the present disclosure, the PCM 196A may be connected to a positive electrode of the battery cell 196B, or may be connected to a negative electrode of the battery cell 196B.

According to an embodiment, the PCM 196A may include a charge control transistor for avoiding over-charging and a discharge control transistor for avoiding over-discharging.

The battery cell 196B may store or generate electricity. The battery cell 196B may be charged or discharge according to the power management module 195. The battery cell 196B may supply power to some or all components of the electronic device 100 managed by the power management module 195.

According to an embodiment, the battery pack 196 may further include a thermistor for measuring a temperature of the battery pack 196 or the battery cell 196B.

According to various embodiments of the present disclosure, the battery pack 196 may include the battery cell 196B, a power transmission terminal electrically connected to both terminals or electrodes of the battery cell 196B, a measurement terminal electrically connected to terminals or electrodes of the battery cell 196B in order to measure the voltage of the battery cell 196B, and the PCM 196A connected to between at least one of the power transmission terminal and at least one terminal of the battery cell 196B. The battery pack 196 may include a passive element, for example, a resistance, to prevent the battery cell from being damaged due to a surge between the measurement terminal and the battery cell 196B.

According to an embodiment, the electronic device 100 may include a sensing line electrically connecting the both terminals of the battery cell 196B, the measurement terminal, and the power management module 195. The electronic device may include a power transmission path electrically connecting both terminals of the battery cell 196B, the power transmission terminal, and the power management module 195.

According to an embodiment of the present disclosure, the battery pack 196 may include an over-current protection circuit including the battery cell 196B, and a switching element responsive to an occurrence of over-current, and may include a first protection circuit which is electrically connected to at least one stage of the battery cell in order to monitor the voltage of the PCM 196A electrically connected to at least one terminal of the battery cell, and the battery cell, and which includes at least one first passive element.

According to an embodiment of the present disclosure, the battery cell 196B may be electrically connected between a first node and a second node. According to an embodiment, a protection circuit (e.g., an over-current protection circuit, the PCM) may be electrically connected between the first node and the power management module 195 (e.g., the power management IC). A first protection circuit including a first passive element may be electrically connected between the first node and the power management module 195. A second protection circuit including a second passive element may be connected between the second node and the power management module 195. According to an embodiment, the first and second passive elements may include a resistance element respectively.

According to an embodiment, the protection circuit may include a first terminal, a second terminal, and a switching element responsive to the over-current occurrence. The second terminal of the protection circuit may be electrically connected with the power management module 195.

According to an embodiment, the power management module 195 may monitor the voltage of the battery cell 196B based on at least a portion of the voltage or current which is transmitted through the first protection circuit or the second protection circuit.

According to an embodiment, the first node may be electrically connected to a negative electrode of the battery cell 196B, and the second node may be electrically connected to a positive electrode of the battery cell 196B.

The indicator 197 may indicate one or more statuses (e.g., boot status, message status or charge status) of the electronic device 100 or a portion thereof (e.g., the AP 110). The motor 198 may convert electrical signal into mechanical vibration. A multipoint control unit (MCU) 199 may control the sensor module 140.

Although not illustrated, the electronic device 100 may include a processing unit (e.g., a Graphics Processing Unit (GPU)) for supporting a module TV. The processing unit for supporting a module TV may process media data according to standards such as, for example, Digital Multimedia Broadcasting (DMB), Digital Video Broadcasting (DVB), media flow, and/or the like.

According to various embodiments of the present disclosure, each of the above-described elements of the electronic device 100 may include one or more components, and the name of the relevant element may change depending on a type of electronic device 100. According to various embodiments of the present disclosure, the electronic device 100 may include at least one of the above-described elements. Some of the above-described elements may be optional for the electronic device 100, or the electronic device 100 may further include additional elements. In addition, according to various embodiments of the present disclosure, some of the elements of the electronic device 100 may be combined into one entity, which may perform functions identical to those of the relevant elements before the combination.

FIG. 2 is a block diagram illustrating an electronic device 200 according to an embodiment of the present disclosure.

The electronic device 200 may be the electronic device 100 of FIG. 1. The electronic device 200 may include a power input unit 210, a power management module 230, a system 201, and a battery pack 250. The power input unit 210 may be electrically connected to the power management module 230. The Power management module 230 may be connected to the power input unit 210, the system 201 or the battery pack 250. The system 201 may be connected to the power management module 230. The battery pack 250 may be connected to the power management module 230.

The power input unit 210 may be connected to the interface module 170 of FIG. 1, or may be a charging module of a wireless type which is connected to the power management module 230. For example, the power input unit 210 may be connected to an external power supply device such as a travel charger (Travel Adapter (TA) or Travel Charger (TC)) for converting AC power to DC power.

According to an embodiment, the power management module 230 may include a power control module 231, a first switch unit 233, and a second switch unit 235.

The power control module 231 may control the operation of the first switch unit 233 or the second switch unit 235. According to an embodiment, the power control module 231 may include a device that can detect the heating of the electronic device 200. According to an embodiment, the power control module 231 may detect the current of the power input unit 210 or the battery pack 250 through the first switch unit 233 or the second switch unit 235.

The first switch unit 233 may include a first transistor (T1) which has a terminal connected to the power input unit 210, and another terminal connected to a first node (N1), and which receives a signal output from the power control module 231, a second transistor (T2) which has a terminal connected to the first node (N1), and a different terminal connected to a ground, and which receives a signal output from the power control module 231, and an inductor (L) connected between the first node (N1) and the second node (N2).

The first switch unit 233 may adjust or control the power transmitted to the system 201 or the battery pack 250 from the power input unit 210 under the control of the power control module 231. The first switch unit 233 may detect a current transmitted to the system 201 or the battery pack 250 from the power input unit 210.

The second switch unit 235 may include a third transistor (T3) which has a terminal connected to the battery pack 250, and the other terminal connected to a second node (N2), and which receives a signal output from the power control module 231. The system 201 may be connected to the second node (N2), and the system 201 may be supplied with the power transmitted through the power control module 231 or the power transmitted through the battery pack 250 via the second node (N2).

The second switch unit 235 may adjust or control the power transmitted to the battery pack 250 from the power input unit 210 or the power transmitted to the system 201 from the battery pack 250 under the control of the power control module 231. The second switch unit 235 may detect a current inputted/outputted to/from the battery pack 250.

According to an embodiment, the second switch unit 235 may self-discharge the battery pack 250 (e.g., the battery cell 253) by using the third transistor (T3) under the control of the power control module 231. For example, after configuring a circuit where a terminal of the third transistor (T3) is connected to a ground, the battery pack 250 may be connected to ground under the control of the power control module 231, and accordingly, the battery pack 250 may be self-discharged.

According to an embodiment, the power control module 231 may control the first switch unit 233 or the second switch unit 235, so that the electronic device 200 may control the power supplied to the system 201 or the battery pack 250.

For example, if the first transistor, T1, the second transistor, T2, and the third transistors, T3, are N-type metal-oxide-semiconductor (NMOS) transistors, when the power control module 231 outputs a high signal to the first switch unit 233 and to the second switch unit 235, power may be supplied to the system 201 or the battery via the power input unit 210. For example, if the first transistor, T1, the second transistor, T2, and the third transistors, T3, are NMOS transistors, when the power control module 231 outputs a low signal to the first switch unit 233 and outputs a high signal to the second switch unit 235, the power supplied to the system 201 or the battery pack 250 via the power input unit 210 may be blocked. The embodiment of the present disclosure is not limited to the case where the first transistor, T1, the second transistor, T2, and the third transistors, T3, are NMOS transistors, but may be a p-channel metal-oxide-semiconductor (PMOS) transistor, and the first transistor, T1, the second transistor, T2, and the third transistors, T3, may be transistors that form different channels, respectively.

According to an embodiment, the first transistor, T1, the second transistor, T2, and the third transistors, T3, may be controlled by a signal output to the power control module 231 via a gate, and the width of the channel may be changed according to the intensity of the signal output to the power control module 231. For example, according to the intensity of the signal output to the power control module 231, the first switching unit 233 may increase or decrease the power supplied to the system 201 or the battery from the power input unit 210. According to the intensity of the signal output to the power control module 231, the second switch unit 235 may increase or decrease the power supplied to the battery pack 250 from the power input unit 210 or the power supplied to the system 201 from the battery pack 250.

According to an embodiment, the power control module 231 may check the voltage of the battery cell 253 in a fourth node N4 point. For example, the voltages in respective nodes N1, N2, N3 and N4 may be different from each other. Current flows in each circuit, and accordingly, the voltages measured in respective nodes N1, N2, N3 and N4 are different due to the resistance of respective elements. According to an embodiment of the present disclosure, the power control module 231 may change the charging method of the battery pack 250 from the CC method to the CV method based on the voltage (i.e., the voltage of the fourth node N4) of the battery cell 253. For example, when the power control module 231 measures the voltage of the battery pack 250 (i.e., the voltage of the third node N3), the voltage value for a protection circuit 251 may be added to measure a relatively higher voltage in comparison with the voltage of the battery cell 253 (i.e., the voltage of the fourth node N4). For example, if a reference value for changing the charging method of the battery is 4.2V, when the charging method is changed based on the voltage of the battery pack 250 (i.e., the voltage of the third node N3), the charging method may be more rapidly changed to the CV method in comparison with the case in which the charging method is changed based on the voltage of the battery cell 253 (i.e., the voltage of the fourth node N4). Thus, a total charging time of the battery cell 253 may be increased by reducing the CC charging time for a high-speed charging. According to various embodiments of the present disclosure, the voltage of the battery cell 253 may be accurately measured, and the charging method may be changed based on the voltage of the battery cell 253, thereby reducing the total charging time and increasing a battery charging efficiency.

According to an embodiment, the battery pack 250 may include the protection circuit 251 (e.g., protection circuit module (PCM)) and the battery cell 253.

The protection circuit 251 may include a self-discharge circuit to protect the battery pack 250 (e.g., the battery cell 253). According to an embodiment, the protection circuit 251 may include a circuit for avoiding over-discharging, over-charging, over-current in order to protect the battery pack 250. For example, the protection circuit 251 may avoid the over-charging, the over-discharging or the over-current of the battery cell 253, based on the voltage characteristic of the battery cell 253.

According to an embodiment, the protection circuit 251 may include a separate self-discharge circuit. The self-discharge circuit may include a resistance, a thermistor or a temperature sensing element, a comparator, and a switch. The self-discharge circuit may compare a reference voltage with the voltage of the battery cell 253 through a comparator in hardware and control the switch.

The system 201 may be other element of the electronic device 200 excluding the battery pack 250. For example, the system 201 may be at least one of the display module 160, the input module 150, the sensor module 140, the AP 110, the communication module 120, the memory 130, or the audio module 180 of FIG. 1.

The battery cell 253 may store or generate electricity, and may supply power to the electronic device 200 by using the stored or generated electricity.

Figure 3A:
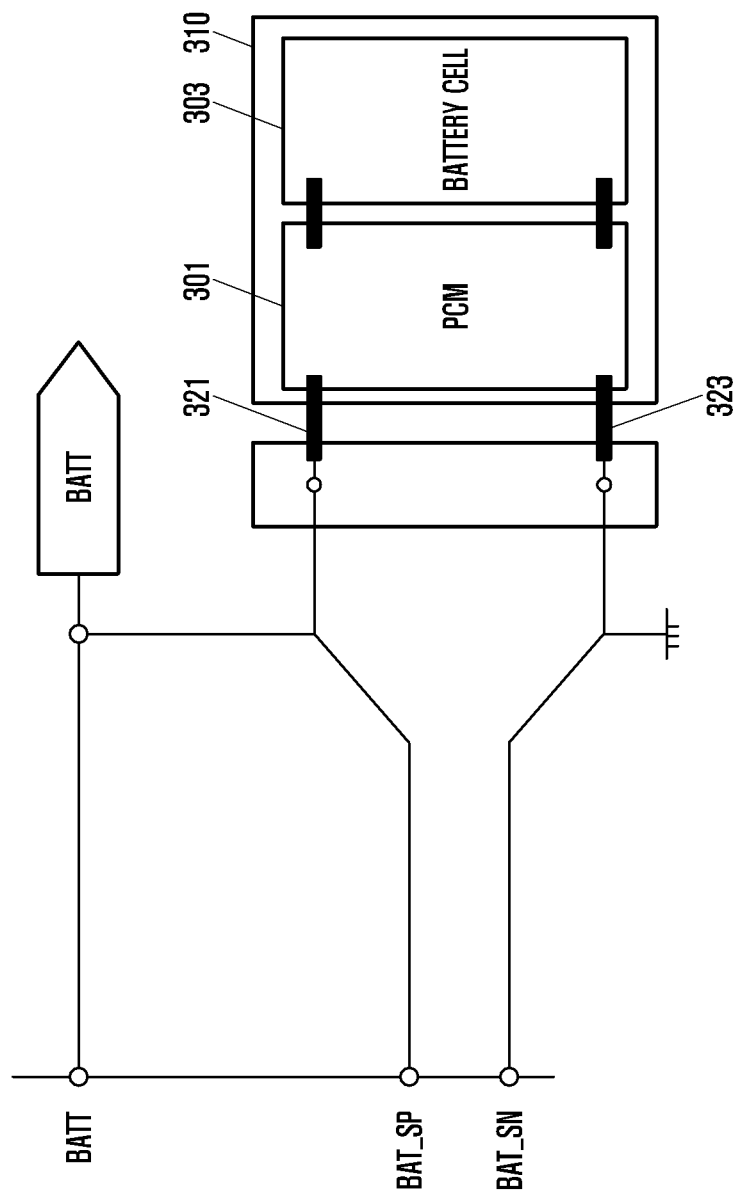
FIGS. 3A and 3B are diagrams illustrating an operation of measuring a battery cell voltage of an electronic device according to various embodiments of the present disclosure.
Figure 3B:
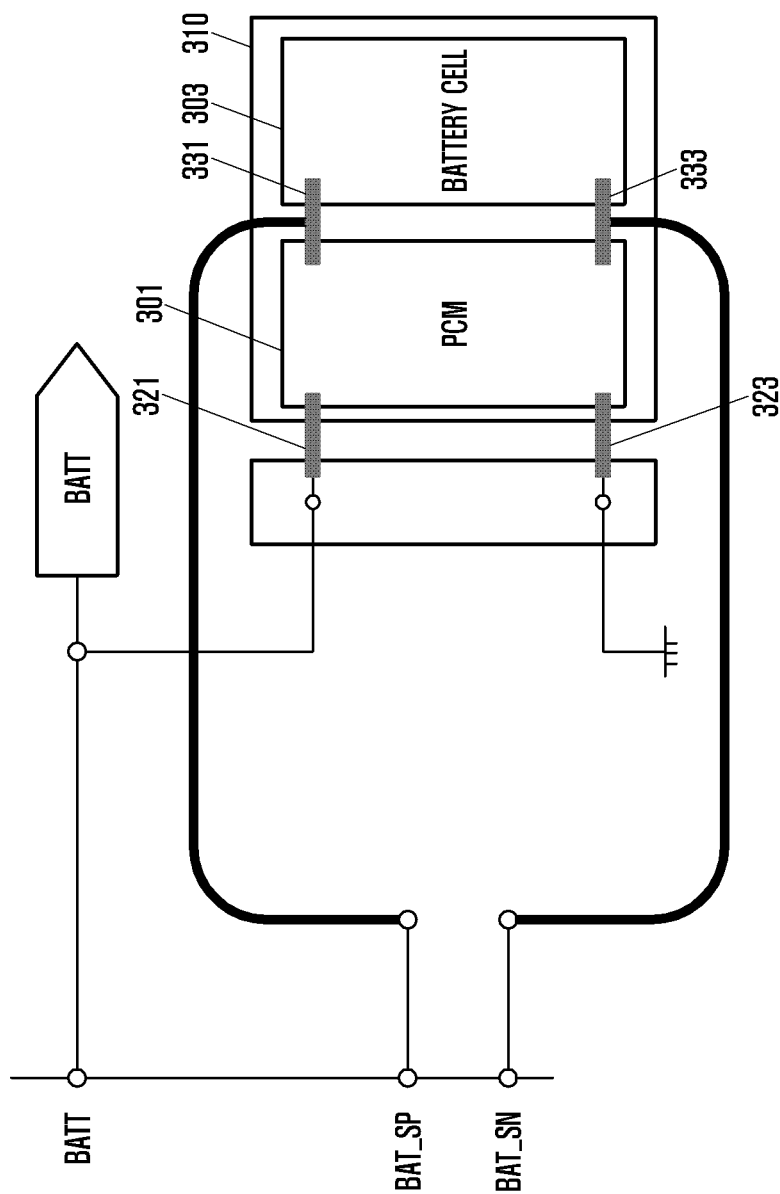

FIGS. 3A and 3B are diagrams illustrating an operation of measuring a battery cell voltage of an electronic device according to various embodiments of the present disclosure.

FIG. 3A is a diagram illustrating a schematic configuration of the electronic device 100 when the electronic device 100 measures a battery terminal (e.g., the voltage BATT of a battery pack 310). According to an embodiment, the battery pack 310 may include a protection circuit module (PCM) 301 and a battery cell 303. The battery pack 310 may be connected to a terminal for sensing a voltage through connection units 321, 323. A negative electrode (−) of the battery pack 310 may be connected to a ground and a terminal BAT_SN for sensing a negative electrode (e.g., ground) of the battery terminal. A positive electrode (+) of the battery pack 310 may be connected to a terminal BAT_SP for sensing a positive electrode of the battery cell 303. The electronic device 100 may sense the terminal connected to the battery pack and measure a whole voltage of the battery pack 310. In this case, the electronic device 100 may convert the CC-CV method for charging based on the voltage of the battery pack 310.

FIG. 3B is a diagram illustrating a schematic configuration of the electronic device 100 when the electronic device 100 measures a voltage of the battery cell 303. The battery pack 310 may include the PCM 301 and the battery cell 303. The battery cell 303 may be connected to the PCM 301 through connection units 331, 333 (e.g., a conductor or the like). The PCM 301 may be connected to a terminal for sensing through connection units 321, 323. A (−) terminal of the PCM 301 may be connected to ground, and a (+) terminal may be connected to a terminal BATT for sensing a whole voltage of the battery pack 310. According to an embodiment, in order to measure the own voltage of the battery cell 303, the (+) terminal (e.g., the connection unit 331) of the battery cell 303 may be connected to the terminal BAT_SP for measuring the positive electrode of the battery cell 303. The (−) terminal (e.g., the connection unit 333) of the battery cell 303 may be connected to the terminal BAT_SN for measuring the negative electrode of the battery cell 303. According to an embodiment, when measuring the voltage of the battery cell 303, the electronic device 100 may measure the voltage of the battery cell 303 in a differential sensing method, without grounding the negative electrode of the battery cell 303.

Figure 4:
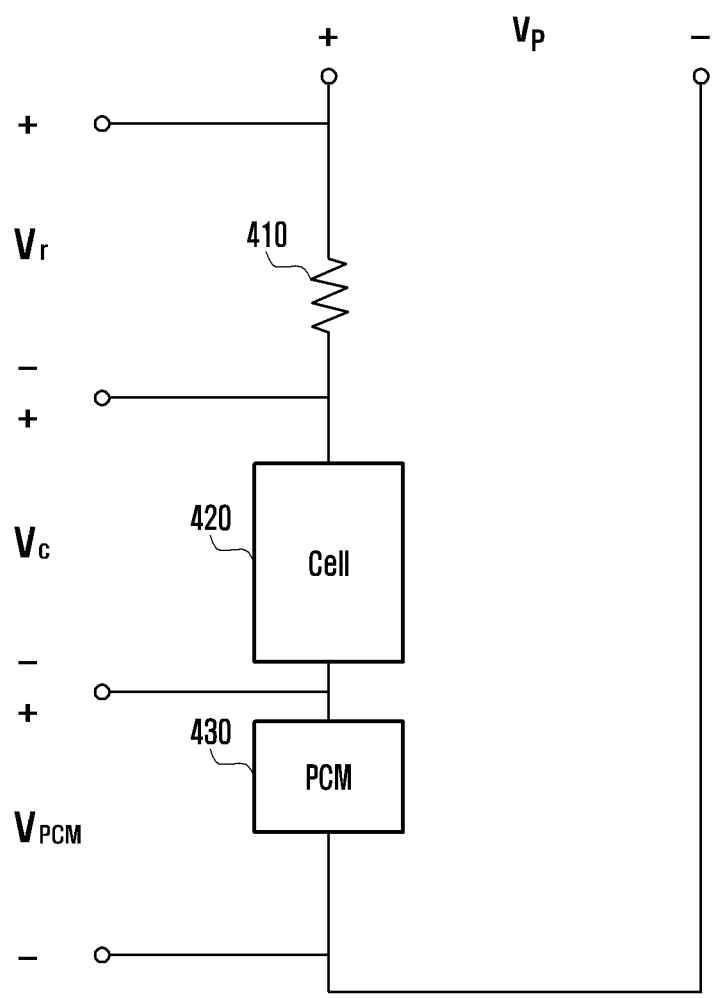
FIG. 4 is a schematic circuit diagram for illustrating an operation of measuring a battery cell voltage of an electronic device according to various embodiments of the present disclosure.

FIG. 4 is a schematic circuit diagram for illustrating an operation of measuring a battery cell voltage of the electronic device 100 according to various embodiments of the present disclosure. FIG. 4 is a schematic circuit diagram illustrating the battery pack of the electronic device 100 according to various embodiments of the present disclosure. According to an embodiment, the battery pack may include a resistance component (e.g., a PTC thermistor, etc.) 410, a battery cell 420, and a PCM 430. In this case, a battery pack voltage Vp may be a voltage between two terminals at the top. A battery cell 420 voltage Vc may be a voltage between two terminals in the left side. When current flows in the battery pack, the battery pack voltage Vp may be a value obtained by adding a PCM 430 voltage ($V_{PCM}$) and a resistance voltage Vr to the battery cell voltage Vc. That is, the battery pack voltage Vp may be greater than the battery cell voltage Vc. For example, battery pack voltage Vp=battery cell voltage Vc of the voltage+PCM voltage (VPCM)+resistance voltage Vr.

According to various embodiments of the present disclosure, the electronic device 100 may change the charging method based on a more accurate charging voltage, by controlling the charging operation based on the battery cell voltage Vc not the battery pack voltage Vp. The electronic device 100 may shorten a total charging time by increasing the CC charging time based on the power charged in the battery cell 420 without an unnecessary voltage error (i.e., a voltage (e.g., Vr, $V_{PCM}$) of elements excluding the voltage of the actually charged battery cell 420).

Figure 5:
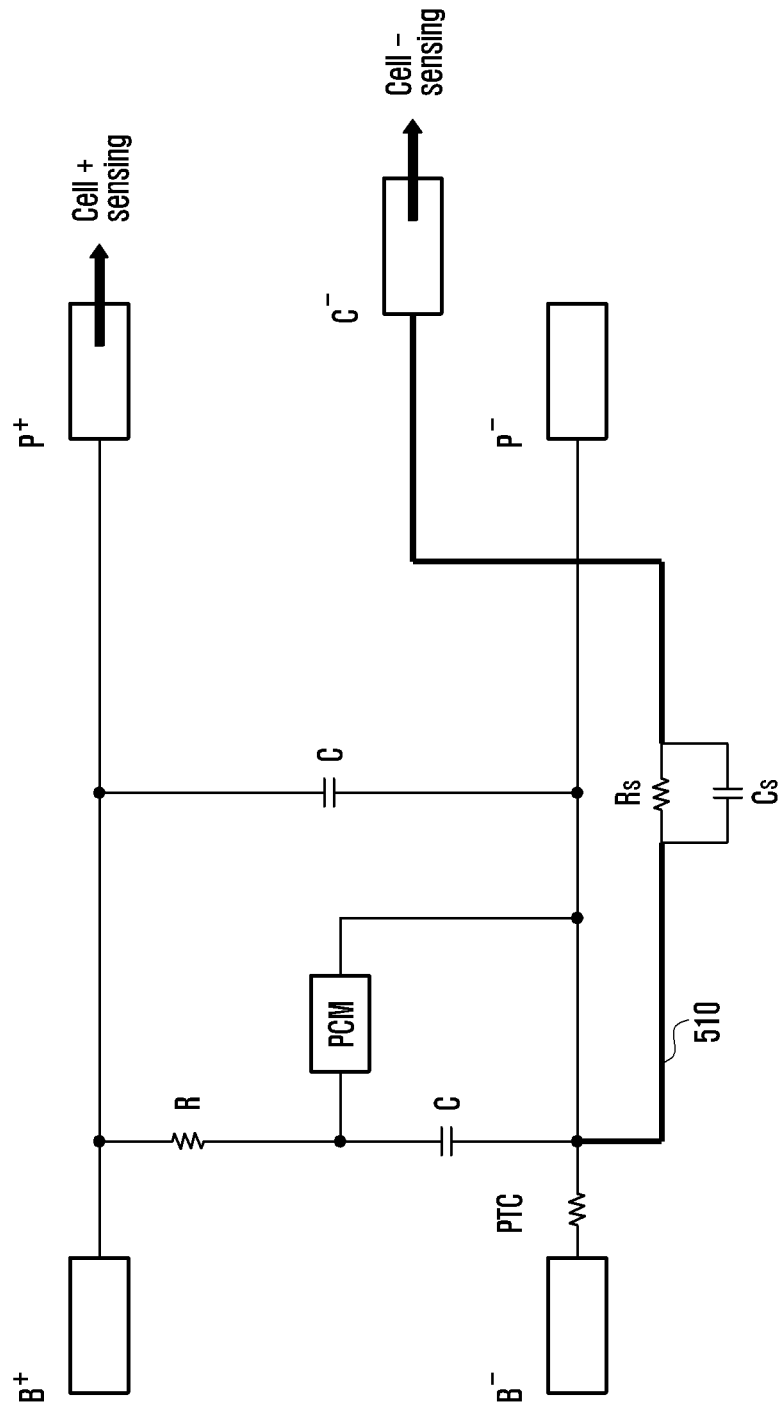
FIG. 5 is a schematic configuration diagram for illustrating an operation of measuring a battery cell voltage of an electronic device according to various embodiments of the present disclosure.

FIG. 5 is a schematic configuration diagram for illustrating an operation of measuring a battery cell voltage of an electronic device according to various embodiments of the present disclosure.

According to an embodiment, the battery pack of the electronic device 100 may include a PTC thermistor, a PCM, and a battery cell. The electronic device 100 may include a sensing line 510 for sensing the battery cell voltage. The sensing line 510 may be configured of a line having high impedance so that only minute current may flow. The sensing line 510 may include an element (Rs, Cs) to avoid surge. According to an embodiment, in a circuit which includes terminals (P+, P−) for measuring the voltage of the battery pack, the electronic device 100 may separately sense only the voltage of the battery cell through the terminals (P+, C−) for measuring only the voltage of the battery cell excluding the PCM, a resistance R connected to the PCM, and a capacitor C.

The electronic device 100 may control the charging operation based on the battery cell voltage by performing a remote sensing for the battery cell voltage using a differential sensing. For example, the electronic device 100 may increase a CC charging section in the CC-CV charging based on the battery cell voltage, and may shorten the total charging time of the battery cell by reducing the CV charging time.

Figure 6:
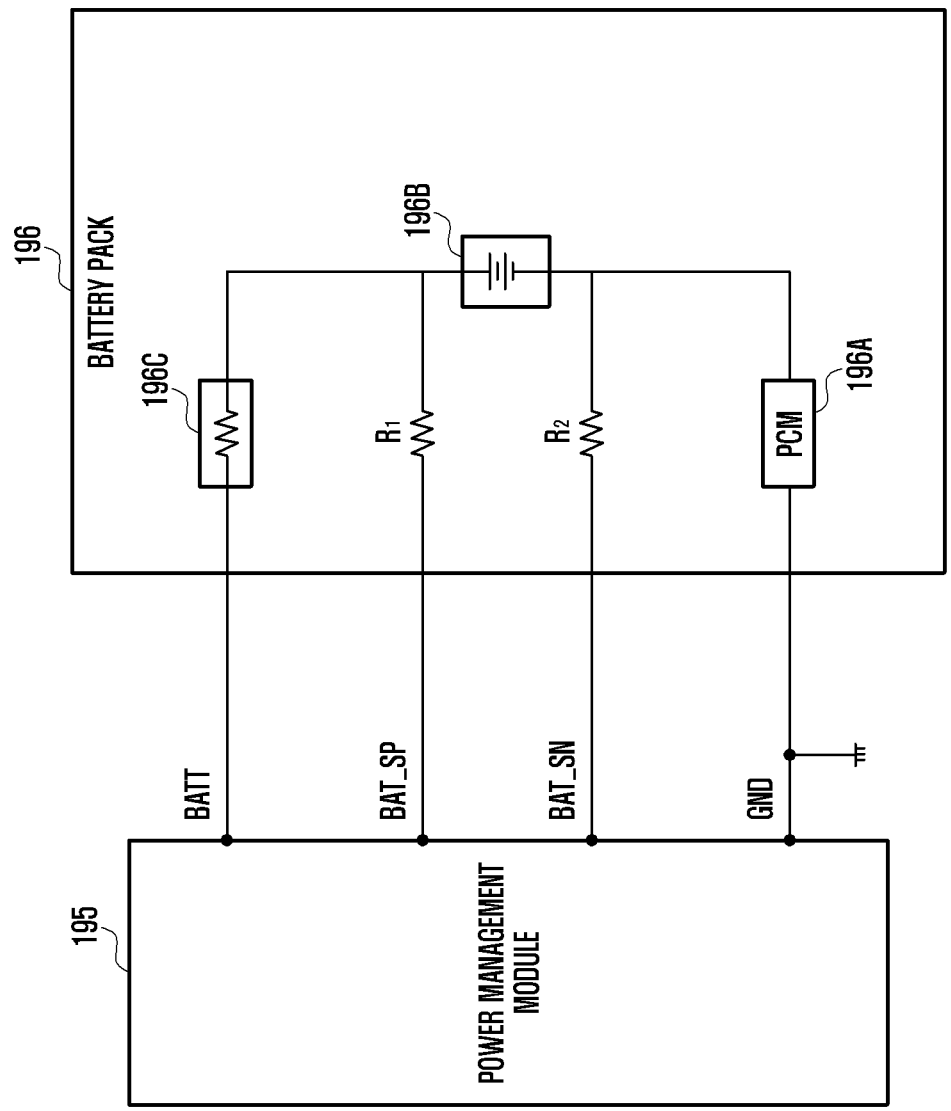
FIG. 6 is a schematic configuration diagram for illustrating an operation of measuring a battery cell voltage of an electronic device according to various embodiments of the present disclosure.

FIG. 6 is a schematic configuration diagram for illustrating an operation of measuring a battery cell voltage of the electronic device 100 according to various embodiments of the present disclosure.

The power management module 195 may control the charging and discharging of the battery pack 196. The power management module 195 may be electrically connected to the battery pack 196. The battery pack 196 may include the PCM 196A for detecting the over-discharge, over-charging and over-current of the battery pack 196, the battery cell 196B, and a thermistor 196C. A terminal of the PCM 196A may be connected with the power management module 195. A line connecting the PCM 196A with the power management module 195 may be connected to ground. Both terminals of the battery cell 196B may be connected to the power management module 195 via sensing lines BAT_SP and BAT_SN. The sensing lines BAT_SP and BAT_SN may configured of a conductor having high impedance. The sensing lines BAT_SP and BAT_SN may include resistances R1 and R2 to prevent the battery cell 196B from being damaged due to a surge. The thermistor 196C may be connected to the power management module 195. The power management module 195 may sense a line BATT connected to a terminal of the thermistor 196C to measure the voltage of the battery pack 196.

The power management module 195 may determine the voltage of the battery cell 196B by performing a differential sensing for the sensing lines BAT_SP, BAT_SN. The power management module 195 may control the charging based on the voltage of the battery cell 196B. For example, when the voltage of the battery cell 196B is at or above a preset reference value, the power management module 195 may switch the charging method to the constant voltage CV method from the constant current CC method. The power management module 195 may determine a buffer of the battery cell 196B. The power management module 195 may determine whether the voltage of the battery cell 196B has reached a preset buffer voltage.

Figure 7:
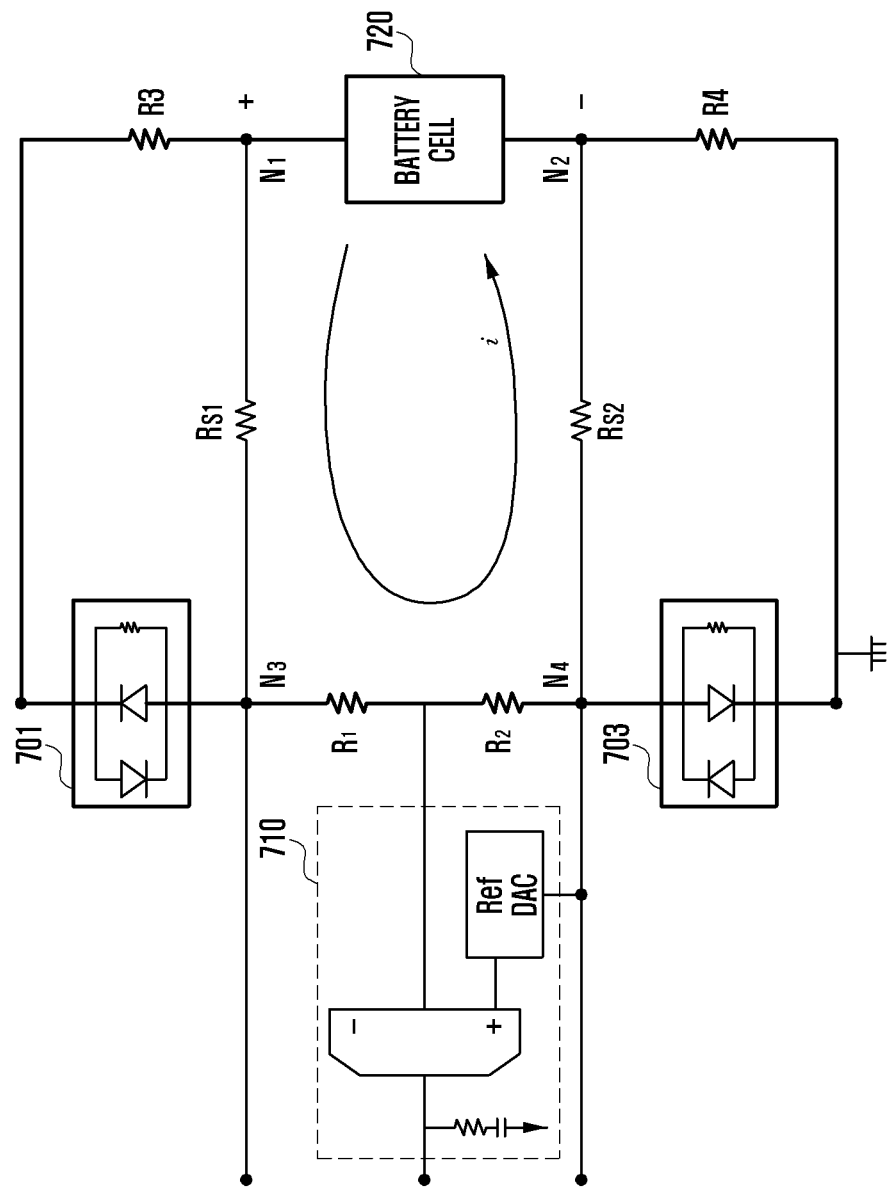
FIG. 7 is a diagram illustrating a method for controlling a charging of an electronic device according to various embodiments of the present disclosure.

FIG. 7 is a diagram illustrating a method for controlling a charging of the electronic device 100 according to various embodiments of the present disclosure. FIG. 7 is a schematic circuit diagram illustrating a portion of the battery pack 196 and the power management module 195 of the electronic device 100 according to an embodiment of the present disclosure. According to an embodiment, the battery pack 196 of the electronic device 100 may include a battery cell 720 and separate resistance components R3 and R4. The battery cell 720 may be electrically connected between the first node N1 and the second node N2. According to various embodiments of the present disclosure, the positive electrode of the battery cell 720 may be connected to the node N1, and the negative electrode may be connected to the node N2. Alternatively, the positive electrode of the battery cell 720 may be connected to the node N2, and the negative electrode may be connected to the node N1.

For example, when the electronic device 100 senses the voltage of the battery cell 720, the PCM, the thermistor, and other devices included in the battery pack 196 may be considered as internal resistances R3, R4 connected to the battery cell 720.

According to an embodiment, the electronic device 100 may include elements 701, 703 for rectification or removing a noise in a circuit connected to the battery cell 720. According to an embodiment, the electronic device 100 may include resistances R1 and R2 for dividing a voltage in a conductor (e.g., a conductor between a node N3 and a node N4) connecting a terminal of the sensing lines for measuring the voltage of the battery cell 720. According to an embodiment, the electronic device 100 may include a comparator circuit 710 for comparing a voltage between the resistances R1 and R2 with a preset specific voltage. The comparator circuit 710 may include a converter (not shown), such as, for example, a digital-to-analog converter (DAC) to provide a specific voltage as a reference. The electronic device 100 may compare the specific voltage with the voltage of a battery terminal (the battery cell 720 or the battery pack, etc.) using the comparator circuit 710. The comparator circuit is not an essential element, and may be changed variously, and the specific voltage value for comparing the voltage may also be set with different values for various embodiments of the present disclosure.

According to an embodiment of the present disclosure, the electronic device 100 may measure the voltage of the battery cell 720. According to an embodiment, the electronic device 100 may determine an error due to current i and resistances Rs1 and Rs2 included in the line for measuring the battery cell in order to determine the exact voltage of the battery cell 730. For example, as shown in FIG. 7, when the current i flows through the node N1, the node N3, the node N4, and the node N2, the voltage across the resistances Rs1 and Rs2 should be considered in order that the electronic device 100 can accurately measure the voltage of the battery cell 720. The electronic device 100 may store the values of the resistances Rs1 and Rs2. The electronic device 100 may calculate the exact voltage of the battery cell 720 by subtracting the voltage across the resistances Rs1 and Rs2 from a voltage value measured in the circuit for sensing the voltage of the battery cell 720.

Figure 8A:
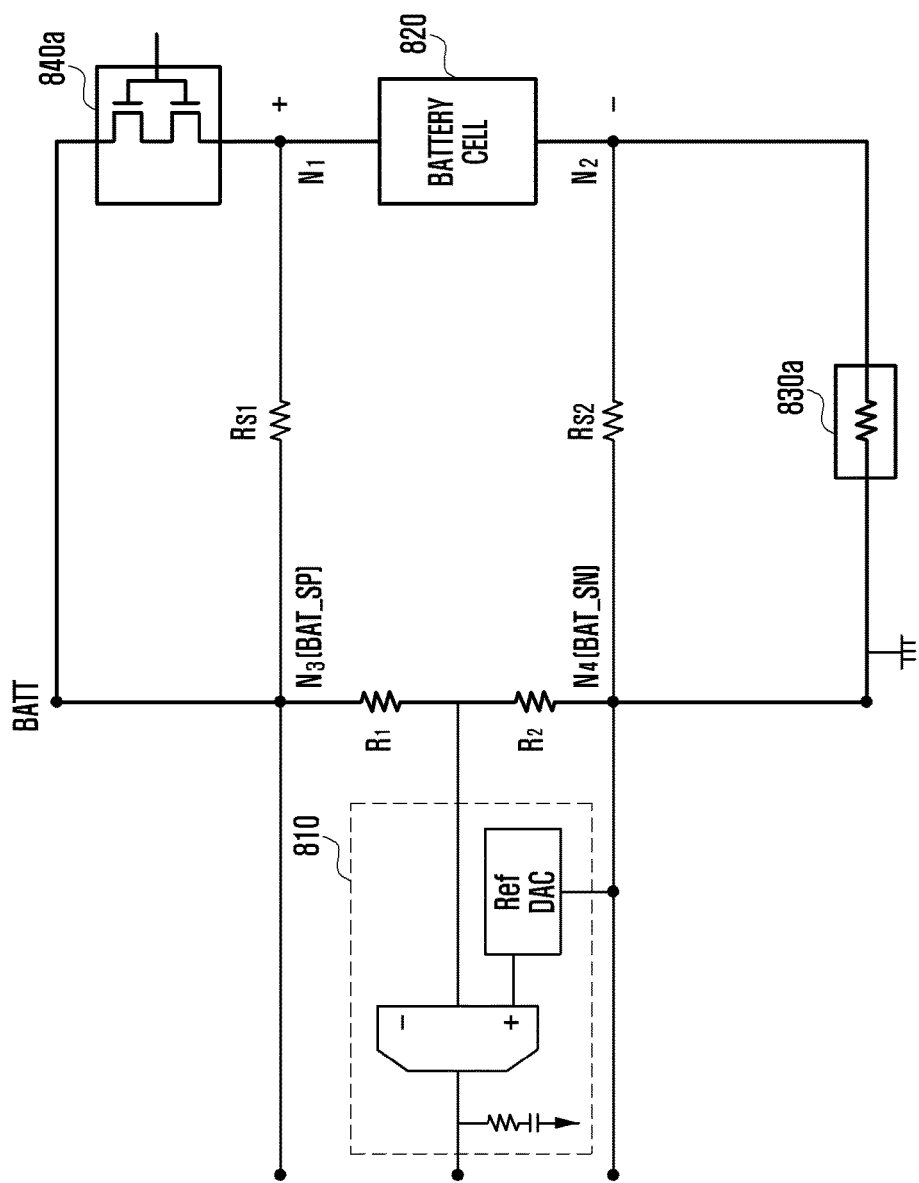
FIGS. 8A and 8B are diagrams illustrating a charge control method in accordance with a configuration of an electronic device according to various embodiments of the present disclosure.
Figure 8B:
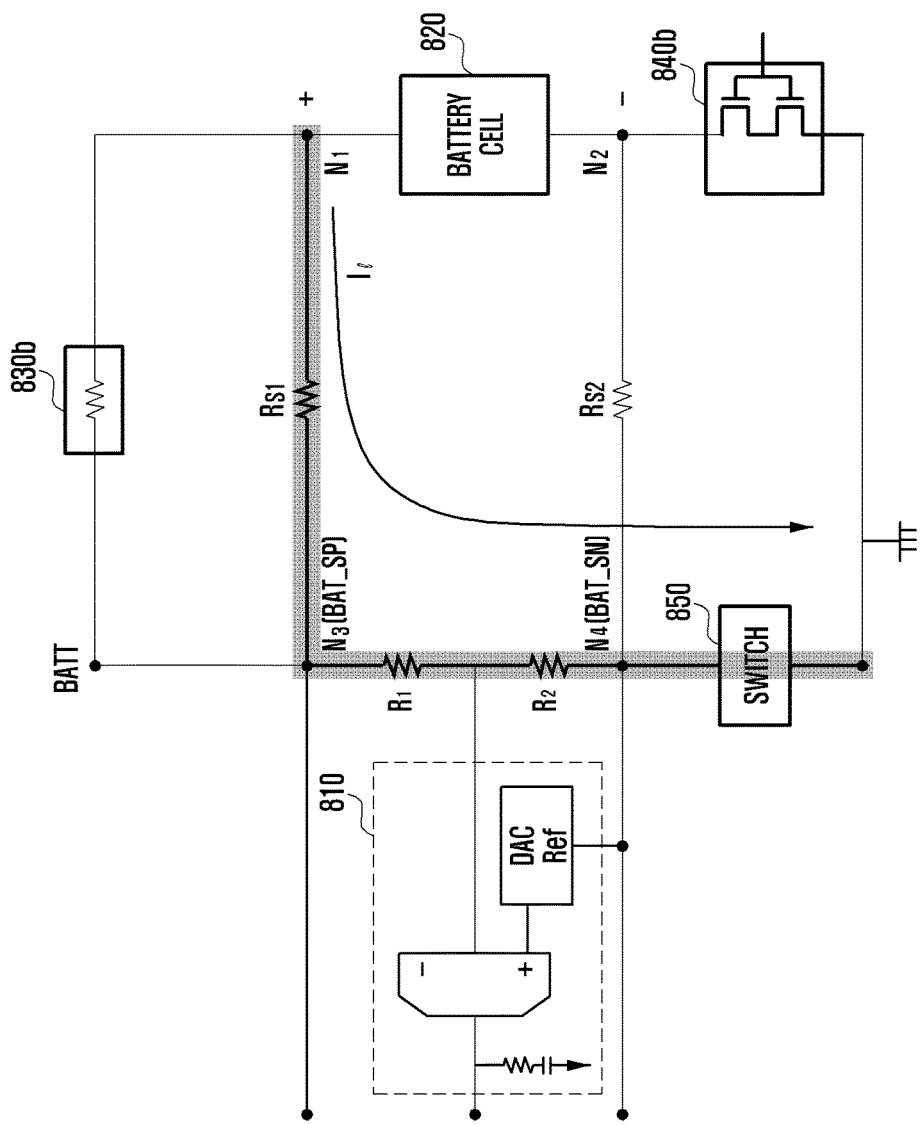

FIGS. 8A and 8B are diagrams illustrating a charge control method in accordance with a configuration of an electronic device according to various embodiments of the present disclosure. Hereinafter, a description of a configuration similar to FIG. 7 is omitted.

FIG. 8A illustrates that a protection circuit PCM 840a is connected to a (+) terminal of a battery cell 820, i.e., a positive electrode terminal N1, and a thermistor 830a is connected to a (−) terminal of the battery cell 820, i.e., a negative electrode terminal. According to an embodiment, the electronic device 100 may measure the voltage of the battery cell 820 through a sensing line (e.g., a first protection circuit between the nodes N2 and N4 and a second protection circuit between nodes N1 and N3) for measuring the voltage of the battery cell 820. For example, the electronic device 100 may determine the voltage of the battery cell 820 by measuring the voltage of sensing points BAT_SP and BAT_SN connected to the battery cell. That is, the electronic device may determine the voltage of the battery cell 820 by performing a differential sensing for the voltage of nodes N3 and N4. The sensing line may include at least one passive element (e.g., resistances Rs1 and Rs2) to prevent the battery cell 820 from being damaged by a surge. The electronic device may determine the exact voltage of the battery cell 820 by considering the voltage drop due to Rs1 and Rs2 in addition to the voltage measured at the nodes BAT_SP and BAT_SN.

The electronic device 100 may switch the battery charging method from the CC method to the CV method, when the voltage of the battery cell 820 is at or above a preset reference value. The electronic device 100 may measure a temperature of the battery cell 820 via the thermistor 830a. The electronic device 100 may control the charging of the battery according to the temperature of the battery cell 820. For example, the electronic device 100 may hold or stop the charging operation when the temperature of the battery rises above a certain value.

FIG. 8B illustrates that a thermistor 830b is connected to a (+) terminal of the battery cell 820, i.e., the positive electrode terminal N1, and a protection circuit module (PCM) 840b is connected to the (−) terminal of the battery cell 820, i.e., the negative electrode terminal N2.

The electronic device 100 may measure the voltage of the battery cell 820 at the voltage sensing points BAT_SP and BAT_SN of the battery cell 820. For example, the electronic device 100 may measure the voltage of the battery cell 820 by performing a differential sensing for the nodes N3 and N4. The electronic device 100 may switch the battery charging method from the CC method to the CV method, when the voltage of the battery cell 820 is at or above a preset reference voltage value.

According to an embodiment, the electronic device 100 may generate a leakage path due to a line for sensing the voltage of the battery cell 820. For example, when there is no separate line for sensing the battery cell 820, if the PCM 840b is open, a circuit where the battery cell 820 is directly connected to ground may be disconnected so that a separate power leakage path may not occur. When there is a sensing line for sensing the battery cell 820, even if the PCM 840b is open, a leakage path including a sensing line may occur. For example, a leakage path (the shaded path of FIG. 8B) which is connected to ground via the nodes N1, N3, and N4 may occur.

According to an embodiment of the present disclosure, the electronic device 100 may further include a switch 850 for blocking the leakage path in the circuit including the sensing line. The electronic device 100 may control the switch 850 according to the operation state of the PCM 840b. For example, when the PCM 840b is open, the electronic device 100 may control the switch 850 to open the circuit connected to the switch 850. That is, the electronic device 100 may block the leakage path of the power stored in the battery cell 820 by opening the switch 850. According to an embodiment, the electronic device 100 may measure the voltage of the battery pack or the battery cell 820, and may determine that the PCM is opened based on the measured voltage of the battery pack or the battery cell 820. For example, the electronic device 100 may detect the PCM is opened by detecting the voltage change in the battery pack (or, the battery cell) over a certain amount.

According to various embodiments, the switch 850 may be located in the node in which the leakage current may flow to ground from the positive electrode of the battery cell 820. For example, the switch 850 may be arranged at any point in the leakage path (e.g., the path connected to ground via the nodes N1, N3, and N4).

According to an embodiment, when the voltage of the battery cell 820 is at or above a preset threshold, the electronic device 100 may control the switch 850. For example, when the voltage of the battery cell 820 is at or above a preset threshold, the electronic device 100 may control the switch 850 to open the connected circuit.

Figure 9:
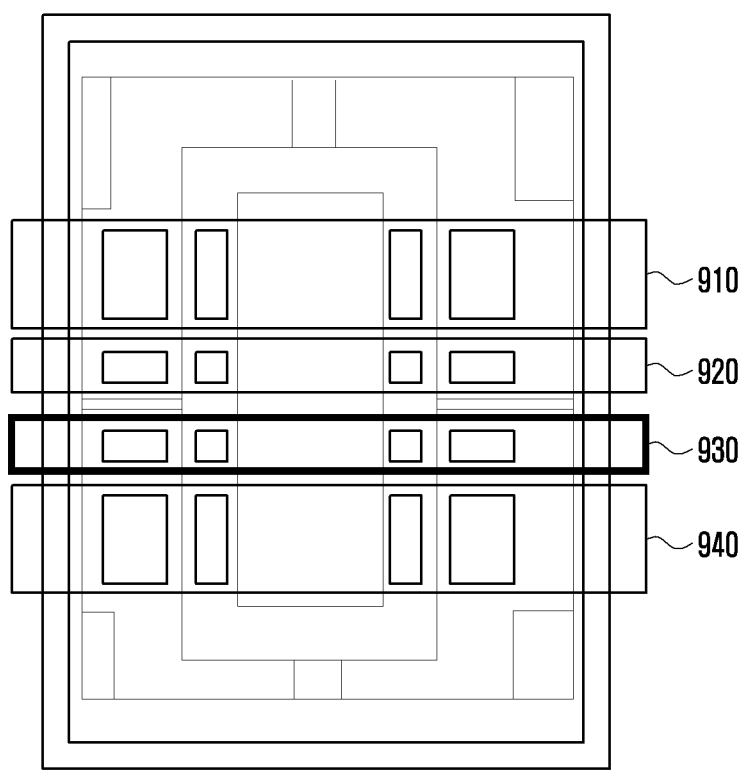
FIG. 9 is a diagram illustrating a connector of an electronic device according to an embodiment of the present disclosure.

FIG. 9 is a diagram illustrating a connector of the electronic device 100 according to an embodiment of the present disclosure.

According to various embodiments of the present disclosure, the connector may electrically connect the battery pack to the power management module 195, and may include a sensing pin for sensing the voltage of the battery cell. The connector may be located on the surface of the battery pack, and may be connected to the battery pack via a conductive material (e.g., wire). The electronic device may further include a connector in a printed circuit board (PCB) inside the electronic device so that the connector which is connected to the battery pack and the power management module may be electrically connected.

FIG. 9 briefly illustrates a substrate of the connector according to various embodiments of the present disclosure. The substrate of the connector may include pins 910 for the battery pack voltage, pins 920 for battery identification, and pins 940 for a ground line. In particular, according to various embodiments of the present disclosure, the substrate of the connector may include pins 930 for sensing the own voltage of the battery cell. According to various embodiments of the present disclosure, a position, a shape, an arrangement and a configuration of each of the pins provided to the connector substrate is not limited to FIG. 9, but may be changed variously.

Figure 10:
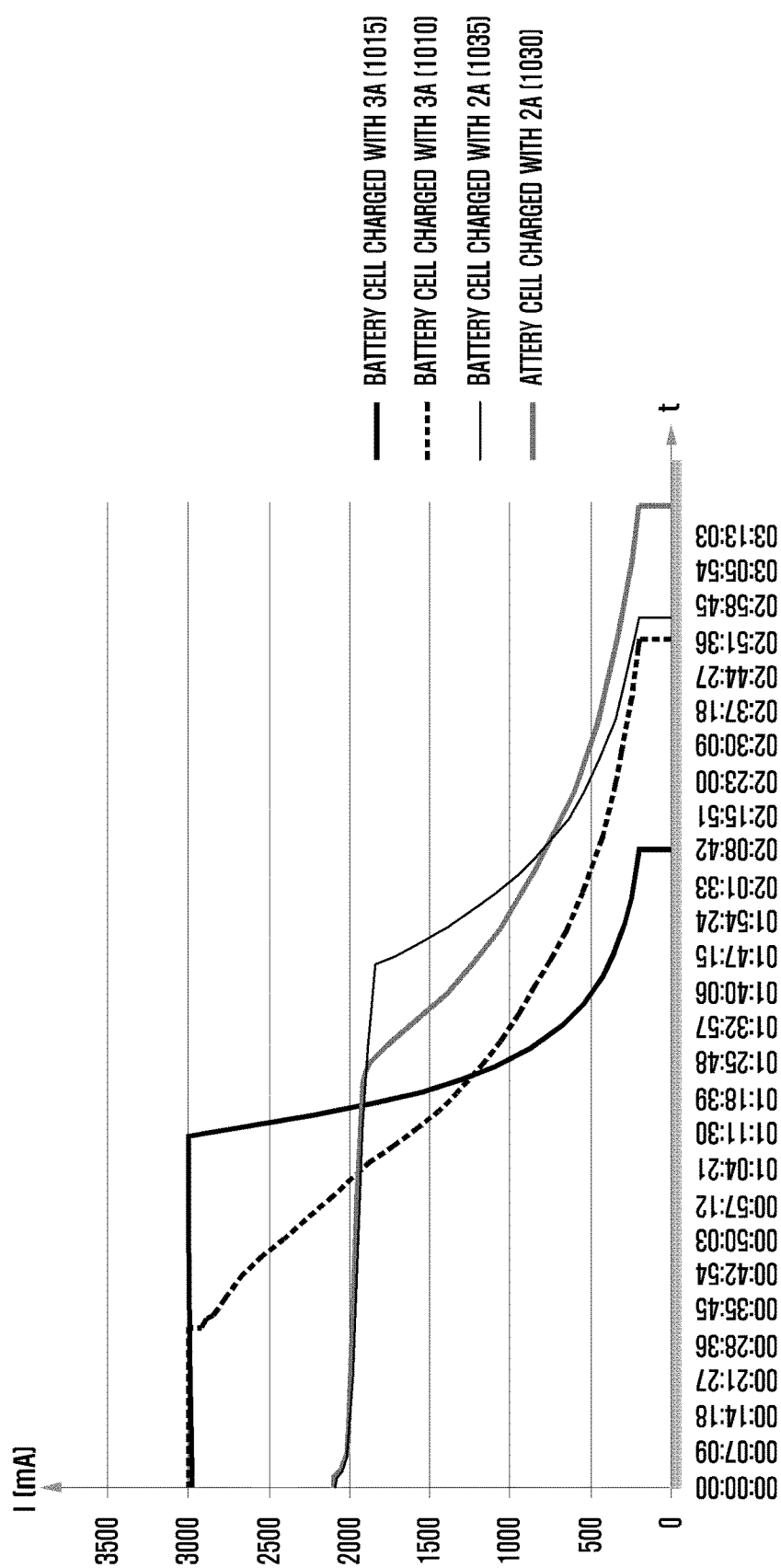
FIG. 10 is a diagram illustrating a change in current due to a battery charging of an electronic device according to various embodiments of the present disclosure.

FIG. 10 is a diagram illustrating a change in current due to a battery charging of the electronic device 100 according to various embodiments of the present disclosure. Each graph in FIG. 10 shows a case in which the charging method is switched according to a reference voltage determining the CC-CV when the battery pack or cell of the same capacity is charged by using other charging current. Referring to each graph, it can be seen that the CC charging that charges the battery cell using a certain charging current is progressed in an initial process of a charging procedure and, then, the charging current is decreased as the CC charging is changed to the CV charging.

It can be seen that the CC charging period may be maintained longer when the charging is controlled based on the voltage of the battery cell, if the case 1010 of a battery pack charged with a current of 3 A is compared with the case 1015 of a battery cell charged with a current of 3 A, and if the case 1030 of a battery pack charged with a current of 2 A is compared with the case 1035 of a battery cell charged with a current of 2 A. In addition, it can be seen that a total battery charging time is shorten in the case of controlling the charging based on the voltage of the battery cell.

That is, according to various embodiments of the present disclosure, the electronic device 100 may sense the voltage of the battery cell storing an actual power not the voltage of the battery pack, and control the CC-CV charging based on the battery cell voltage, thereby shortening a total charging time.

Figure 11:
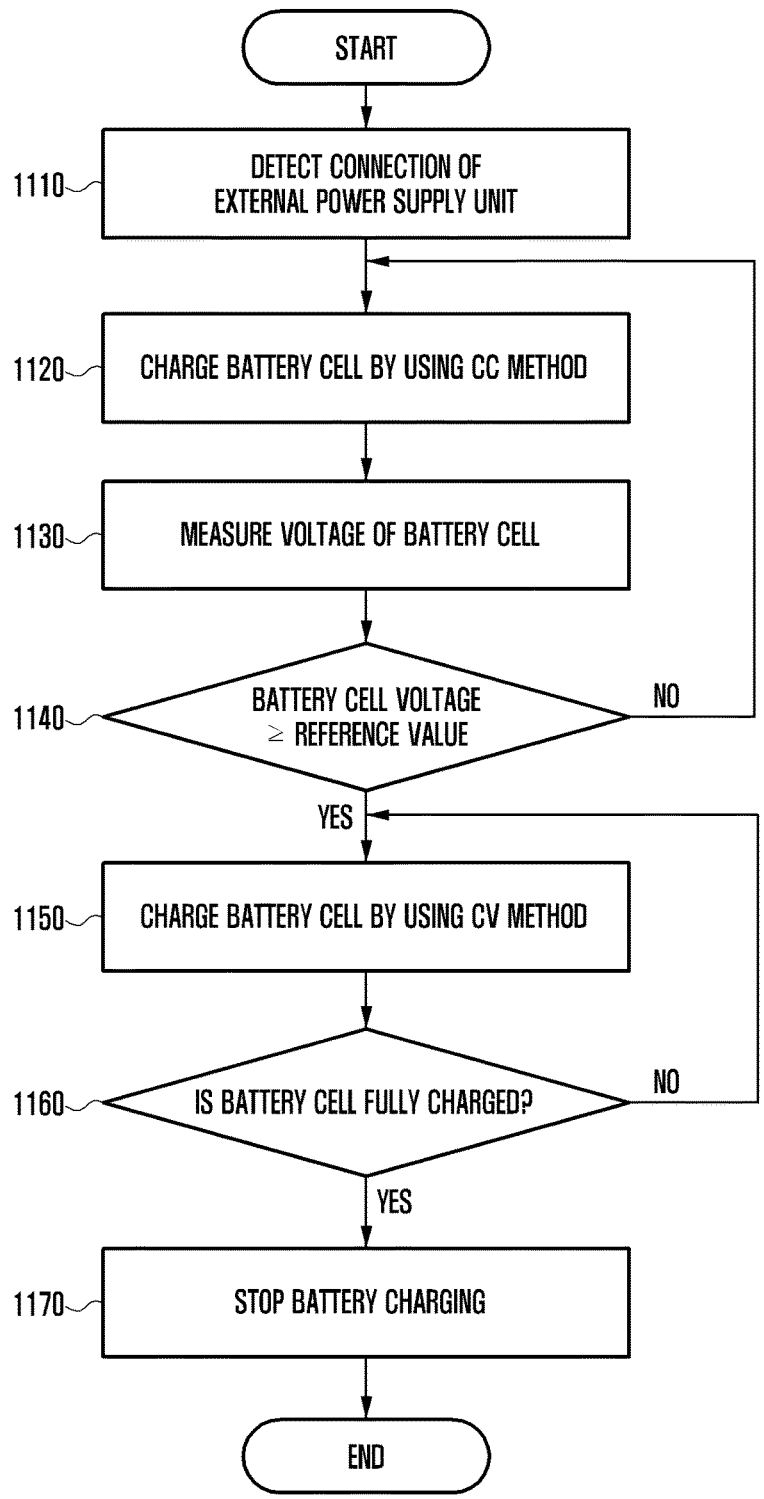
FIG. 11 is a flowchart illustrating a method for charging an electronic device according to an embodiment of the present disclosure.

FIG. 11 is a flowchart illustrating a method for charging the electronic device 100 according to an embodiment of the present disclosure.

At operation 1110, the electronic device 100 may detect a connection of an external power supply unit. For example, the electronic device 100 may determine that the external power supply unit is connected, when being supplied with power from the external power supply unit (e.g., TA, etc.), or when detecting a specific signal.

At operation 1120, the electronic device 100 may initiate charging of the battery cell 196B. For example, the electronic device 100 may initiate charging of the battery cell 196B via the CC method. That is, the electronic device 100 may transfer a charging current of a preset value to the battery cell 196B from the power supplied from the external power supply unit. For example, the electronic device 100 may provide a constant charging current of 3 A to the battery cell 196B.

At operation 1130, the electronic device 100 may measure the voltage of the battery cell 196B. The electronic device 100 may measure the voltage of the battery cell 196B via a sensing line connected to the battery cell 196B. According to an embodiment, the sensing line may be connected to at least one of both terminals (a positive electrode terminal and a negative electrode terminal) of the battery cell 196B. The sensing line may have high impedance to flow only a negligible minute current. The sensing line may include a passive element, for example, a resistance to prevent the battery cell 196B from being damaged by a surge. That is, the electronic device 100 according to an embodiment of the present disclosure may sense the voltage of the battery cell 196B while preventing the battery cell 196B from being damaged. According to an embodiment, the electronic device 100 may measure the voltage of the battery cell 196B using remote sensing through a differential sensing method.

At operation 1140, the electronic device 100 may determine whether the voltage of the battery cell 196B is at or above a preset reference value. The reference value may be a reference voltage value for changing the CC charging to the CV charging by the electronic device 100. For example, the reference value may be a voltage value when the charging of the battery cell 196B approaches a full charging. The electronic device 100 may perform operation 1150 when the voltage of the battery cell 196B is at or above the reference value. The electronic device 100 may continue to perform the CC charging at operation 1120 when the voltage of the battery cell 196B is less than the reference value.

At operation 1150, the electronic device 100 may switch the charging method from the CC method to the CV method. For example, the electronic device 100 may gradually reduce the charging current of a fixed specific value (e.g., 3 A current) supplied to the battery cell 196B. For example, if the reference value is 4.2V, when the voltage of the battery cell 196B reaches 4.2 V, the charging current supplied to the battery cell 196B may be reduced gradually.

At operation 1160, the electronic device 100 may determine whether the battery cell 196B is fully charged. When the battery cell 196B is fully charged, the electronic device 100 may stop the battery charging operation at operation 1170. When the battery cell 196B is not fully charged, the electronic device 100 may continue to charge the battery cell 196B.

Figure 12:
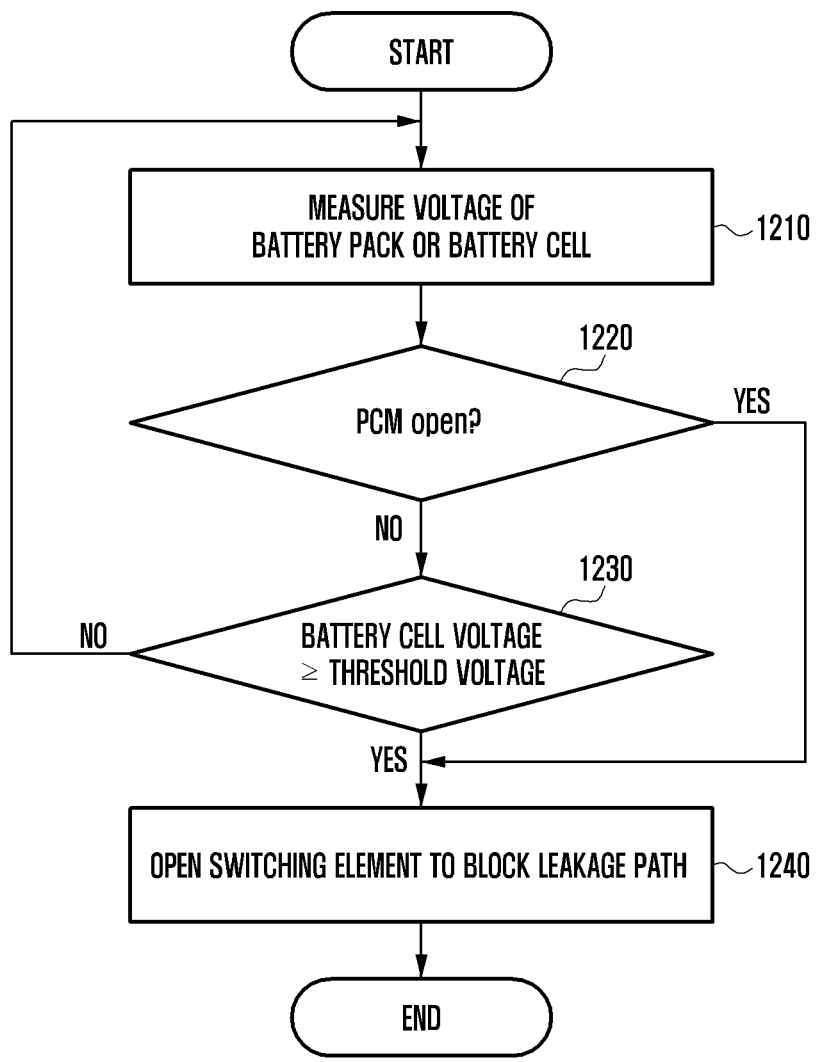
FIG. 12 is a flowchart illustrating a control method for avoiding a leakage current in an electronic device according to an embodiment of the present disclosure.

FIG. 12 is a flowchart illustrating a control method for avoiding a leakage current in the electronic device 100 according to an embodiment of the present disclosure.

At operation 1210, the electronic device 100 may measure the voltage of the battery pack 196 or the battery cell 196B. For example, the electronic device 100 may measure the whole voltage of the battery pack 196. The electronic device 100 may measure the voltage of the battery cell 196B using remote sensing through a differential sensing.

At operation 1220, the electronic device 100 may detect the open of the PCM 196A based on the measured voltage of the battery pack 196 or the battery cell 196B. For example, the electronic device 100 may detect that the voltage of the battery pack 196 (or the voltage of the battery cell 196B) is changed over a certain amount and may determine the open of the PCM 196A. When the PCM 196A is open, the electronic device 100 may perform operation 1240. When the PCM 196A is not open, the electronic device 100 may perform operation 1230.

At operation 1230, the electronic device 100 may determine whether the voltage of the battery cell 196B is at or above a preset threshold voltage value. The threshold voltage value may be a voltage value set in order to detect the over-charging of the battery cell 196B. For example, the electronic device 100 may compare the threshold voltage value set for an over voltage protection (OVP) with the determined voltage value of the battery cell 196B. When the voltage of the battery cell 196B is at or above the threshold voltage value, the electronic device 100 may perform operation 1240.

According to various embodiments of the present disclosure, the electronic device 100 may perform the operation 1240 in the case where the voltage of the battery pack 196 is at or above a second threshold voltage value. For example, the electronic device 100 may perform the operation 1240 for controlling the switching element to block a leakage path when at least one of the voltage of the battery pack 196 or the voltage of the battery cell 196B is a preset threshold voltage value.

At operation 1240, the electronic device 100 may open the switching element to block the leakage path. For example, the battery pack 196 of the electronic device 100 may include a sensing line (e.g., a first and a second protection circuits) connected to both terminals of the battery cell 196B to measure the voltage of the battery cell 196B. In this case, a leakage path including the sensing line may be generated. For example, when there is no sensing line, if the PCM 196A connected to a terminal of the battery cell 196B is open, a leakage path to discharge a separate power may not exist. However, when there is a sensing line, even if the PCM 196A connected to the battery cell 196B is opened, a leakage path including the sensing line may be generated. For example, the electronic device 100 may generate a power leakage path in which the battery cell 196B, a protection circuit (e.g., a circuit connected to a terminal of the battery cell and the power management module 195), the power management module 195, and ground are connected. The electronic device 100 may include a switching element for blocking the leakage path in an arbitrary point of the leakage path.

When the PCM 196A is open or the voltage of the battery cell 190B (or the voltage of the battery pack 190) is at or above a preset threshold voltage, the electronic device 100 may open the switching element for blocking the leakage path. That is, according to an embodiment of the present disclosure, the electronic device 100 may block the leakage path generated due to a circuit (e.g., the protection circuit) for sensing the voltage of the battery cell 196B, and may sense the voltage of the battery cell 196B without the leakage of the power stored in the battery cell 196B.

The electronic device 100 according to an embodiment of the present disclosure may include the battery cell 196B, the power management module 195, the PCM 196A connected between the battery cell 196B and the power management module 195, and a first protection circuit including at least one first passive element between the power management module 195 and the battery cell 196B. The electronic device 100 may monitor the voltage of the battery cell 196B based on at least a portion of the voltage or the current which is transmitted through the first protection circuit.

According to an embodiment, the electronic device may include a second protection circuit including at least one second passive element between the power management module 195 and the battery cell 196B. According to an embodiment, the electronic device 100 may monitor the voltage of the battery cell 196B based on the voltage or the current which is transmitted through the second protection circuit. When the voltage of the battery cell 196B is at or above a preset reference voltage, the electronic device 100 may switch the charging method from the constant current CC method to the constant voltage CV method.

According to an embodiment, the electronic device 100 may further include a switching element for blocking the power leakage path in which the second protective circuit, the power management module 195, and ground are connected.

According to an embodiment, when the PCM 196A is opened, the electronic device 100 may control the switching element for blocking the leakage path to open a circuit connected to the switching element for blocking the leakage path.

According to an embodiment, when the voltage of the battery cell 196B is at or above a preset threshold voltage value, the electronic device 100 may control the switching element for blocking the leakage path to open a circuit connected to the switching element for blocking the leakage path.

A computer readable recording medium according to various embodiments of the present disclosure may record at least one program including for executing commands to perform a method for controlling a charging operation of the electronic device 100 including the battery pack 196 including the PCM 196A and the battery cell 196B, and the sensing line which is connected to both terminals of the battery cell 196B and which includes a resistor for preventing the battery cell 196B from being damaged by a surge. In this case, the method for controlling a charging operation may include an operation of detecting that the external power supply unit is connected, an operation of charging the battery pack 196 by the constant current CC method when the external power supply unit is connected, an operation of measuring the voltage of the battery cell 196B through the sensing line, and an operation of changing the charging method into the constant voltage method when the measured voltage of the battery cell 196B is at or above a preset reference voltage.

It will be appreciated that it is possible to implement the above-described embodiments of the present disclosure in the form of hardware, software, or a combination of hardware and software. These arbitrary software may be stored, for example, regardless of whether it is erasable or re-writable or not, in a volatile or non-volatile storage, such as ROM, or, for example, memory such as RAM, a memory chip, device, or integrated circuit, or, for example, a recording medium which is readable by a machine (e.g., a computer) while being able to record optically or magnetically such as CD, DVD, a magnetic disk or a magnetic tape.

The method of utilizing a use log of a portable terminal of the present disclosure and the apparatus using the same of the present disclosure may be implemented by a computer or a portable terminal including a processor and a memory, and it will be apparent that the memory is an example of a program including instructions to implement the embodiments of the present disclosure or a machine-readable medium suitable for storing programs. Accordingly, the present disclosure may include a program including a code for implementing a device or a method according to any of the claims of the present specification and a machine (a computer or the like)-readable medium for storing the program. In addition, such a program may be electronically transferred through an arbitrary medium such as a communication signal transmitted through a wired or wireless connection, and the present disclosure may appropriately include material equivalent to this. Further, the method of utilizing a use log of a portable terminal of the present disclosure and the apparatus using the same may receive and store a program from a program providing apparatus connected by wire or wireless. In addition, the user may adjust the setting of the user's portable terminal and restrict the operation according to an embodiment of the present disclosure to the inside of the user terminal or selectively use to extend the operation to be associated with the server through a network.

According to the electronic device and the method for controlling a charging of the electronic device in accordance with various embodiments of the present disclosure, it is possible to measure the voltage of the battery cell included in the battery pack.

According to the electronic device and the method for controlling a charging of the electronic device in accordance with various embodiments of the present disclosure, it is possible to change the charging method based on the voltage of the battery cell.

According to the electronic device and the method for controlling a charging of the electronic device in accordance with various embodiments of the present disclosure, it is possible to increase the charging time in a constant current method and decrease the charging time in a constant voltage CV method, by controlling the charging based on the battery cell voltage.

According to the electronic device and the method for controlling a charging of the electronic device in accordance with various embodiments of the present disclosure, it is possible to shorten the charging time of the battery by delaying the time to change the charging method from the constant current CC method to the constant voltage CV method based on the battery cell voltage.

According to the electronic device and the method for controlling a charging of the electronic device in accordance with various embodiments of the present disclosure, it is possible to sense the battery cell while preventing the battery cell from being damaged by a surge.

According to the electronic device and the method for controlling a charging of the electronic device in accordance with various embodiments of the present disclosure, it is possible to block the leakage path that may occur according to the sensing of the battery cell to provide an efficient battery charging.

Although embodiments of the present disclosure have been described in detail hereinabove, it should be clearly understood that many variations and modifications of the basic inventive concepts herein taught which may appear to those skilled in the present art will still fall within the spirit and scope of the present disclosure, as defined in the appended claims.

The term "module" used in embodiments of the present disclosure may refer to, for example, a "unit" including one of hardware, software, and firmware, or a combination of two or more thereof. The term "module" may be interchangeable with a term such as a unit, a logic, a logical block, a component, or a circuit. The "module" may be a minimum unit of an integrated component or a part thereof. The "module" may be a minimum unit for performing one or more functions or a part thereof. The "module" may be mechanically or electronically implemented. For example, the "module" according to the present disclosure may include at least one of an Application-Specific Integrated Circuit (ASIC) chip, a Field-Programmable Gate Arrays (FPGA), and a programmable-logic device for performing operations which has been known or are to be developed hereinafter.

According to various embodiments of the present disclosure, at least some of the devices (e.g., modules or functions thereof) or the method (e.g., operations) according to the present disclosure may be implemented by a command stored in a non-transitory computer-readable storage medium in a programming module form. When the command is executed by one or more processors (e.g., the processor), the one or more processors may execute a function corresponding to the command. The non-transitory computer-readable storage medium may be, for example, the memory 130. At least a part of the programming module may be implemented (e.g., executed) by, for example, the processor. At least a part of the programming module may include, for example, a module, a program, a routine, a set of instructions, and/or a process for performing one or more functions.

The non-transitory computer-readable recording medium may include magnetic media such as a hard disk, a floppy disk, and a magnetic tape, optical media such as a Compact Disc Read Only Memory (CD-ROM) and a Digital Versatile Disc (DVD), magneto-optical media such as a floptical disk, and hardware devices specially configured to store and perform a program instruction (e.g., programming module), such as a Read Only Memory (ROM), a Random Access Memory (RAM), a flash memory and the like. In addition, the program instructions may include high class language codes, which can be executed in a computer by using an interpreter, as well as machine codes made by a compiler. The aforementioned hardware device may be configured to operate as one or more software modules in order to perform the operation of various embodiments of the present disclosure, and vice versa.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a battery cell configured to be electrically connected between a first node and a second node;
   an over current protection circuit configured to include a first terminal, a second terminal, and a switching element responsive to an occurrence of over current, and the first terminal is electrically connected to the first node;
   a power management integrated circuit configured to be electrically connected to the second terminal of the over current protection circuit; and
   a first protection circuit configured to be electrically connected between the first node and the power management integrated circuit, and to include a first passive element,
   wherein the power management integrated circuit monitors a voltage of the battery cell, based on at least a portion of a voltage or a current which is transmitted through the first protection circuit.

2. The electronic device of claim 1, further comprising a second protection circuit configured to be electrically connected between the second node and the power management integrated circuit, and to include a second passive element, wherein the power management integrated circuit monitors a voltage of the battery cell, based on a voltage or a current which is transmitted through the second protection circuit.

3. The electronic device of claim 2, wherein the second passive element comprises a resistive element respectively.

4. The electronic device of claim 2, further comprising a third passive element configured to be electrically connected between the second node and the power management integrated circuit.

5. The electronic device of claim 2, further comprising a switching element configured to block a leakage path of a power connected to the second protection circuit, the power management integrated circuit, and ground.

6. The electronic device of claim 5, wherein the power management integrated circuit controls the switching element to block the leakage path according to an operation state of the over current protection circuit.

7. The electronic device of claim 5, wherein the power management integrated circuit opens a circuit connected to the switching element for blocking the leakage path by controlling the switching element for blocking the leakage path, when the over current protection circuit is open.

8. The electronic device of claim 5, wherein the power management integrated circuit opens a circuit connected to the switching element to block the leakage path by controlling the switching element for blocking the leakage path, when the voltage of the battery cell is at or above a preset threshold voltage value.

9. The electronic device of claim 1, wherein the first node is electrically connected to a negative electrode of the battery cell, and the second node is electrically connected to a positive electrode of the battery cell.

10. The electronic device of claim 1, wherein the first passive element includes a resistive element.

11. The electronic device of claim 1, wherein the power management integrated circuit controls a charging operation of the battery cell based on the voltage of the battery cell monitored.

12. The electronic device of claim 1, wherein the power management integrated circuit changes a charging method of the battery cell from a constant current (CC) method to a constant voltage (CV) method, when the voltage of the battery cell is at or above a preset reference voltage.

13. The electronic device of claim 1, wherein the power management integrated circuit monitors the voltage of the battery cell based on a differential sensing method.

14. The electronic device of claim 1, wherein the power management integrated circuit comprises:
   a first switch unit that controls a power transmitted to the battery cell from an interface;
   a second switch unit that controls the power transmitted to at least one of the battery cell from the interface and the electronic device from the battery cell; and
   a power control module configured to control the first switch unit and the second switch unit, and to change a charging method of the battery cell based on the voltage of the battery cell.

15. A method for controlling charging of an electronic device comprising a battery cell electrically connected between a first node and a second node, an over current protection circuit including a first terminal and a second terminal and the first terminal electrically connected to the first node, a power management integrated circuit electrically connected to the second terminal of the over current protection circuit, and a first protection circuit electrically connected between the first node and the power management integrated circuit including a first passive element, the method comprising:

monitoring a voltage of the battery cell, based on at least a portion of a voltage or a current which is transmitted through the first protection circuit.

16. The method of claim 15, wherein the electronic device further comprises a second protection circuit including a second passive element between the power management integrated circuit and the battery cell, and the method further comprising monitoring a voltage of the battery cell, based on a voltage or a current which is transmitted through the second protection circuit.

17. The method of claim 16, wherein the electronic device further comprises a switching element configured to block a leakage path of a power connected to the second protection circuit, the power management integrated circuit, and ground, and the method further comprising opening a circuit connected to the switching element for blocking the leakage path by controlling the switching element for blocking the leakage path, when the over current protection circuit is open.

18. The method of claim 17, further comprising opening the circuit connected to the switching element for blocking the leakage path by controlling the switching element for blocking the leakage path, when the voltage of the battery cell is at or above a preset threshold voltage value.

19. The method of claim 15, wherein the controlling a charging changes a charging method from a constant current (CC) method to a constant voltage (CV) method, when a voltage of the battery cell is at or above a preset reference voltage.

* * * * *